(12) United States Patent
Miyoshi et al.

(10) Patent No.: US 8,415,690 B2
(45) Date of Patent: Apr. 9, 2013

(54) EPITAXIAL SUBSTRATE FOR SEMICONDUCTOR ELEMENT, SEMICONDUCTOR ELEMENT, AND METHOD FOR PRODUCING EPITAXIAL SUBSTRATE FOR SEMICONDUCTOR ELEMENT

(75) Inventors: Makoto Miyoshi, Inazawa (JP); Shigeaki Sumiya, Handa (JP); Mikiya Ichimura, Ichinomiya (JP); Mitsuhiro Tanaka, Tsukuba (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 13/457,931

(22) Filed: Apr. 27, 2012

(65) Prior Publication Data
US 2012/0211765 A1 Aug. 23, 2012

Related U.S. Application Data

(63) Continuation of application No. PCT/JP2010/069663, filed on Nov. 5, 2010.

(30) Foreign Application Priority Data

Nov. 6, 2009 (JP) .................................. 2009-254857

(51) Int. Cl.
*H01L 33/00* (2010.01)
*H01L 21/00* (2006.01)

(52) U.S. Cl. .............. 257/96; 257/94; 257/95; 257/189; 257/615; 257/E33.023; 257/E33.049; 438/47

(58) Field of Classification Search .................... 257/94, 257/95, 96, 189, 615, E33.023, E33.049; 438/47
See application file for complete search history.

(56) References Cited

U.S. PATENT DOCUMENTS

| 6,153,894 | A  | * | 11/2000 | Udagawa | ......................... 257/96 |
| 6,255,004 | B1 |   | 7/2001  | Yoshida |  |
| 6,541,799 | B2 | * | 4/2003  | Udagawa | ......................... 257/94 |

(Continued)

FOREIGN PATENT DOCUMENTS

| JP | 10-163528 A1  | 6/1998  |
| JP | 2001-326232 A1 | 11/2001 |

(Continued)

OTHER PUBLICATIONS

Toshihide Kikkawa, et. al., "*Highly Reliable 250W GaN High Electron Mobility Transistor Power Amplifier*," Japan Journal of Applied Physics, vol. 44, No. 7A, 2005, pp. 4896-4901.

(Continued)

*Primary Examiner* — Jarrett Stark
*Assistant Examiner* — Nicholas Tobergte
(74) *Attorney, Agent, or Firm* — Burr & Brown

(57) ABSTRACT

Provided is an epitaxial substrate using a silicon substrate as a base substrate. An epitaxial substrate, in which a group of group-III nitride layers are formed on a (111) single crystal Si substrate such that a (0001) crystal plane of the group of group-III nitride layers is substantially in parallel with a surface of the substrate, includes: a first group-III nitride layer made of AlN with many defects configured of at least one kind from a columnar or granular crystal or domain; a second group-III nitride layer whose interface with the first group-III nitride layer is shaped into a three-dimensional concave-convex surface; and a third group-III nitride layer epitaxially formed on the second group-III nitride layer as a graded composition layer in which the proportion of existence of Al is smaller in a portion closer to a fourth group-III nitride.

29 Claims, 10 Drawing Sheets

U.S. PATENT DOCUMENTS

| | | | |
|---|---|---|---|
| 6,890,791 B2 | 5/2005 | Ohtsuka et al. | |
| 7,687,828 B2 | 3/2010 | Matsuo et al. | |
| 7,855,386 B2 * | 12/2010 | Bandoh et al. | 257/79 |
| 8,247,796 B2 * | 8/2012 | Makabe et al. | 257/20 |
| 8,306,082 B2 * | 11/2012 | Yoshizumi et al. | 372/44.011 |
| 2011/0001127 A1 * | 1/2011 | Sakamoto et al. | 257/22 |

FOREIGN PATENT DOCUMENTS

| | | |
|---|---|---|
| JP | 2004-349387 A1 | 12/2004 |
| JP | 2005-350321 A1 | 12/2005 |
| JP | 2007-250721 A1 | 9/2007 |
| JP | 2007-311733 A1 | 11/2007 |
| JP | 2009-158804 A1 | 7/2009 |
| WO | 2006/014472 A1 | 2/2006 |
| WO | 2006/060738 A1 | 6/2006 |
| WO | 2008/112097 A2 | 9/2008 |

OTHER PUBLICATIONS

Nariaki Ikeda, et al., "*High Power AlGaN/GaN HFET with a High Breakdown Voltage of Over 1.8kV on 4 inch Si Substrates and the Suppression of Current Collapse*," Proceedings of the 20th International Symposium on Power Semiconductor Devices & IC's, May 18-22, 2008, p. 287.

Takuma Nanjo, et al., "*First Operation of AlGaN Channel High Electron Mobility Transistors*," The Journal of Applied Physics, Applied Physics Express 1, 2008, 011101-1 to 011101-3.

Hisayoshi Matsuo, et al., "*Improvement of Breakdown Voltage in AlGaN/GaN/AlGaN Double-Heterojunction FET with AlN Buffer Layer*," IEICE Technical Report, vol. 106, No. 459, 2007, pp. 189-192.

Kozo Makiyama, et al., "*High Power GaN-HEMT with High Three-Terminal Breakdown Voltage for W-Band Applications*," IEICE Technical Report, vol. 108, No. 376, 2009, pp. 129-133.

International Search Report and Written Opinion dated Feb. 1, 2011.

English Translation of International Preliminary Report on Patentability, Feb. 1, 2011.

\* cited by examiner

F I G . 2
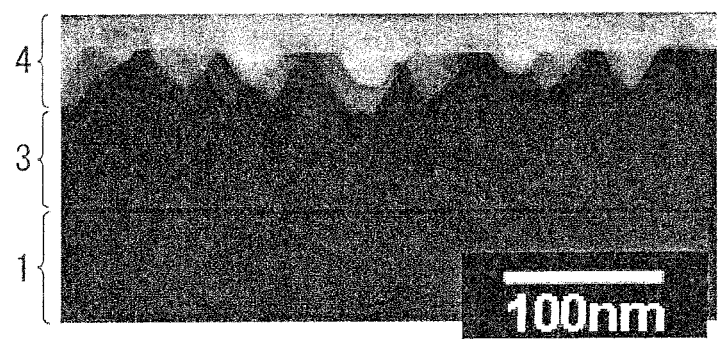

F I G. 3
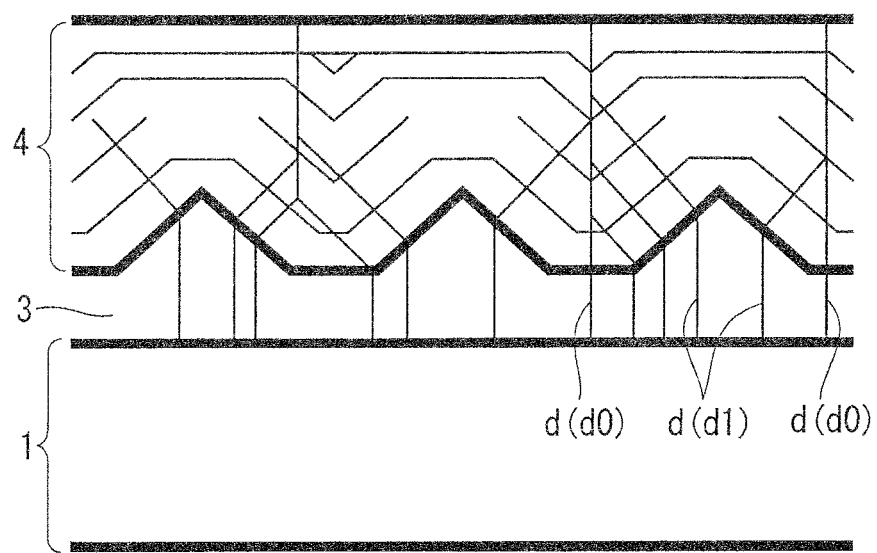

F I G. 5
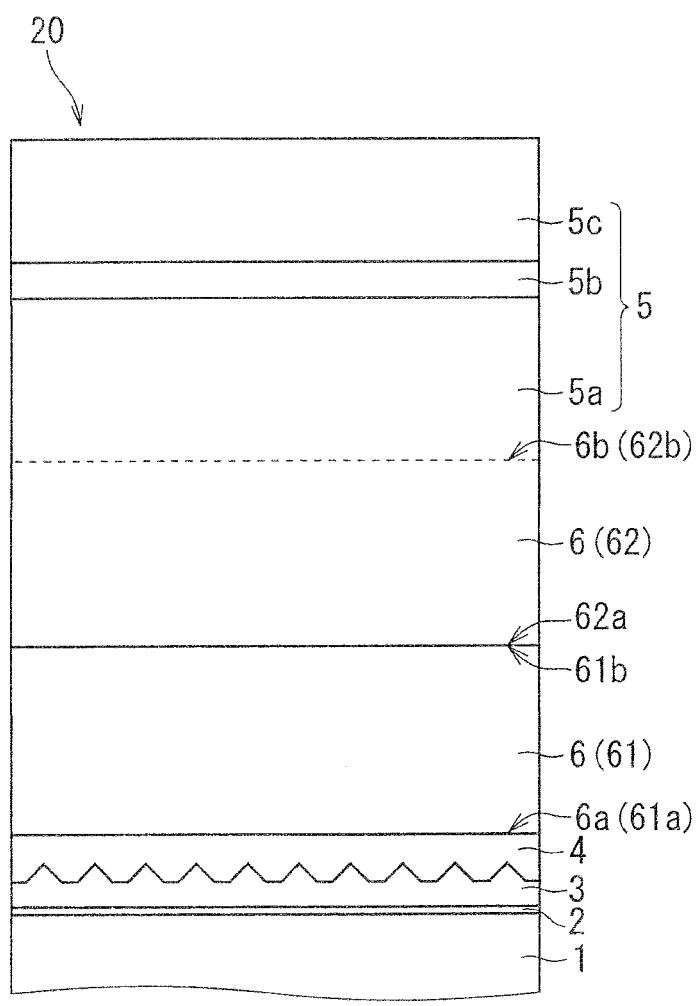

F I G. 6
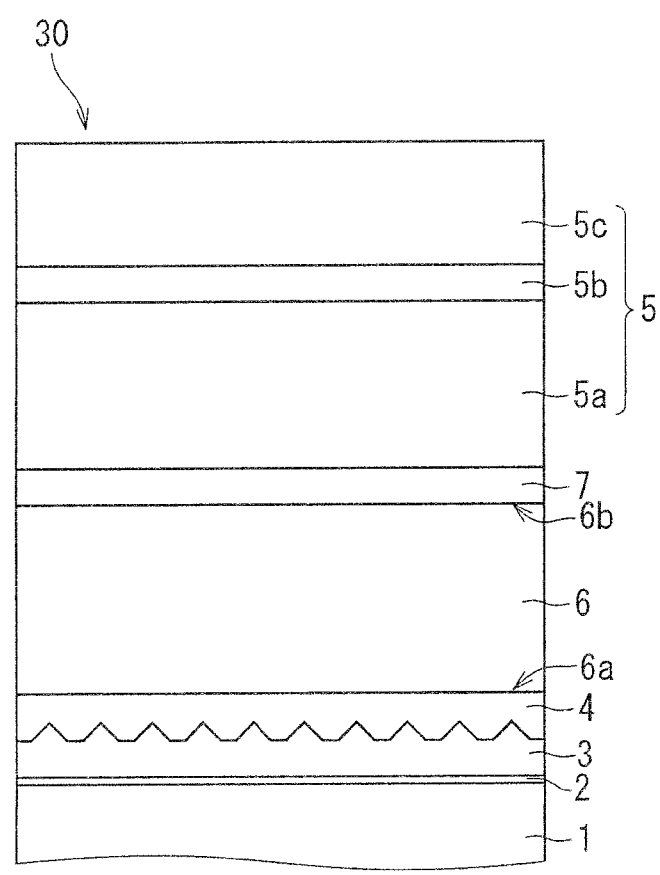

F I G. 7
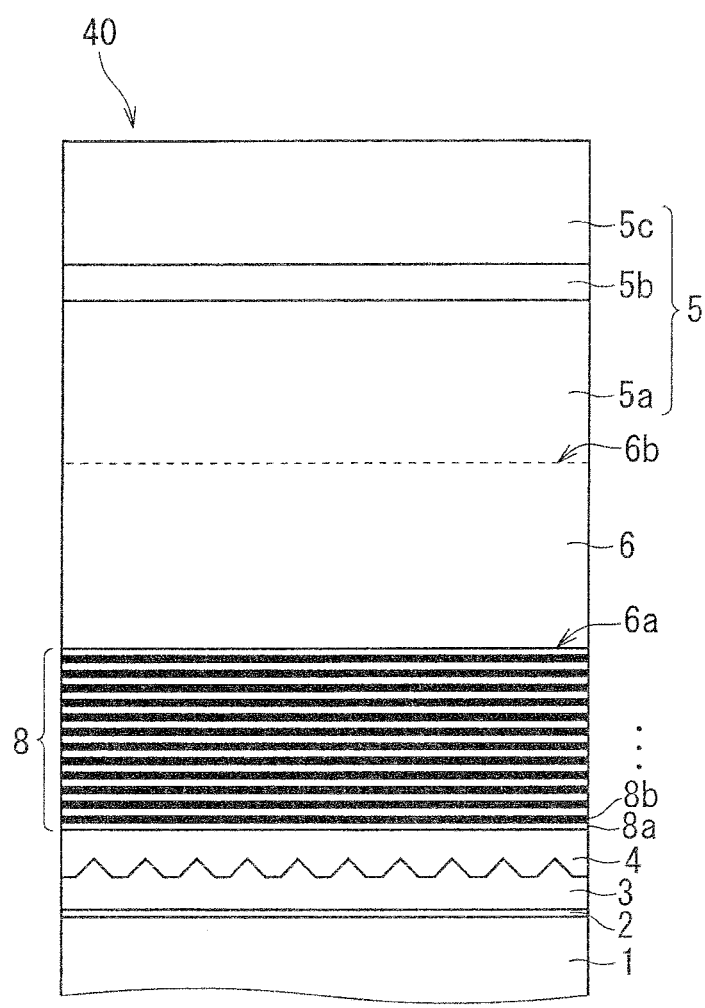

FIG. 9

| | SPECIMEN | TOTAL FILM THICKNESS OF EPITAXIAL FILM (μm) | SURFACE CRACKING | AMOUNT OF WARPING (μm) | DISLOCATION DENSITY IN GaN LAYER (iR/cm²) | LEAKAGE CURRENT (A/cm²) | BREAKDOWN VOLTAGE (V) |
|---|---|---|---|---|---|---|---|
| EXAMPLE 1 | a-1 | 3.15 | NOT OBSERVED | 52 | $1 \times 10^9$ | $1 \times 10^{-6}$ | 980 |
| | a-2 | 3.15 | NOT OBSERVED | 53 | $1 \times 10^9$ | $1 \times 10^{-6}$ | 965 |
| | a-3 | 3.15 | NOT OBSERVED | 55 | $1 \times 10^9$ | $1 \times 10^{-6}$ | 950 |
| | a-4 | 3.15 | NOT OBSERVED | 54 | $1 \times 10^9$ | $1 \times 10^{-6}$ | 960 |
| | a-5 | 3.15 | NOT OBSERVED | 68 | $1 \times 10^9$ | $1 \times 10^{-6}$ | 920 |
| COMPARATIVE EXAMPLE 1 | b-1 | 1.15 | OBSERVED | 75 | $5 \times 10^9$ | — | — |
| | b-2 | 0.95 | NOT OBSERVED | 81 | $5 \times 10^9$ | $1 \times 10^{-6}$ | 180 |
| COMPARATIVE EXAMPLE 2 | c-1 | 3.15 | OBSERVED | 125 | $4 \times 10^9$ | — | — |
| | c-2 | 3.15 | NOT OBSERVED | 145 | $3 \times 10^9$ | $3 \times 10^{-4}$ | 620 |

FIG. 10

| | SPECIMEN | THICKNESS OF GRADED COMPOSITION LAYER (μm) | THICKNESS OF GaN LAYER (μm) | TOTAL FILM THICKNESS OF EPITAXIAL FILM (μm) | SURFACE CRACKING | AMOUNT OF WARPING (μm) | DISLOCATION DENSITY IN GaN LAYER (iR/cm²) | LEAKAGE CURRENT (A/cm²) | BREAKDOWN VOLTAGE (V) |
|---|---|---|---|---|---|---|---|---|---|
| EXAMPLE 1 | a-1 | 2 | 1 | 3.15 | NOT OBSERVED | 52 | $1 \times 10^9$ | $1 \times 10^{-6}$ | 980 |
| EXAMPLE 2 | d-1 | 3 | 3.5 | 6.65 | NOT OBSERVED | 65 | $1 \times 10^9$ | $1 \times 10^{-6}$ | 2245 |
| | d-2 | 2.5 | 2.6 | 5.25 | NOT OBSERVED | 55 | $1 \times 10^9$ | $1 \times 10^{-6}$ | 1760 |
| | d-3 | 2.2 | 1.68 | 4.05 | NOT OBSERVED | 56 | $1 \times 10^9$ | $1 \times 10^{-6}$ | 1343 |
| | d-4 | 1.2 | 0.3 | 1.65 | NOT OBSERVED | 42 | $1 \times 10^9$ | $1 \times 10^{-6}$ | 513 |
| | d-5 | 1 | 0.2 | 1.35 | NOT OBSERVED | 35 | $1 \times 10^9$ | $1 \times 10^{-6}$ | 410 |
| | d-6 | 0.5 | 0.08 | 0.73 | NOT OBSERVED | 22 | $4 \times 10^9$ | $5 \times 10^{-4}$ | 198 |
| | d-7 | 0.7 | 0.13 | 0.98 | NOT OBSERVED | 24 | $4 \times 10^9$ | $5 \times 10^{-4}$ | 284 |
| | d-8 | 1.5 | 0.7 | 2.35 | OBSERVED | 46 | $1 \times 10^9$ | — | — |
| | d-9 | 1.2 | 0.4 | 1.75 | OBSERVED | 41 | $1 \times 10^9$ | — | — |
| | d-10 | 1 | 0.3 | 1.45 | OBSERVED | 30 | $1 \times 10^9$ | — | — |

EPITAXIAL SUBSTRATE FOR SEMICONDUCTOR ELEMENT, SEMICONDUCTOR ELEMENT, AND METHOD FOR PRODUCING EPITAXIAL SUBSTRATE FOR SEMICONDUCTOR ELEMENT

BACKGROUND OF THE INVENTION

1. Field of the Invention

The present invention relates to an epitaxial substrate for use in a semiconductor element and particularly to an epitaxial substrate made of a group-III nitride.

2. Description of Related Art

A nitride semiconductor is attracting attention as a semiconductor material for a light-emitting device such as a LED or a LD and for a high-frequency/high-power electronic device such as a HEMT, because the nitride semiconductor has a wide band gap of direct transition type and the breakdown electric field and the saturation electron velocity thereof are high. For example, a HEMT (high electron mobility transistor) device in which a barrier layer made of AlGaN and a channel layer made of GaN are laminated takes advantage of the feature that causes a high-concentration two-dimensional electron gas (2DEG) to occur in a lamination interface (hetero interface) due to the large polarization effect (a spontaneous polarization effect and a piezo polarization effect) specific to a nitride material (for example, see Non-Patent Document 1).

In some cases, a single crystal (a different kind single crystal) having a composition different from that of a group-III nitride, such as SiC, is used as a base substrate for use in a HEMT-device epitaxial substrate. In this case, a buffer layer such as a strained-superlattice layer or a low-temperature growth buffer layer is generally formed as an initially-grown layer on the base substrate. Accordingly, a configuration in which a barrier layer, a channel layer, and a buffer layer are epitaxially formed on a base substrate is the most basic configuration of the HEMT-device substrate including a base substrate made of a different kind single crystal. Additionally, a spacer layer having a thickness of about 1 nm may be sometimes provided between the barrier layer and the channel layer, for the purpose of facilitating a spatial confinement of the two-dimensional electron gas. The spacer layer is made of, for example, AlN. Moreover, a cap layer made of, for example, an n-type GaN layer or a superlattice layer may be sometimes formed on the barrier layer, for the purpose of controlling the energy level at the most superficial surface of the HEMT-device substrate and improving contact characteristics of contact with an electrode.

On the other hand, in the preparation of the above-mentioned nitride device, research and development have been made concerning the use of single crystal silicon for a base substrate for the purpose of reduction of the cost of an epitaxial substrate, and integration with a silicon-based circuit device, and the like (for example, see Patent Documents 1 to 3, and Non-Patent Document 2). In a case where a conductive material such as silicon is selected as the base substrate of the HEMT-device epitaxial substrate, a field plate effect is applied from a back surface of the base substrate, and therefore a HEMT device can be designed for a high breakdown voltage and high-speed switching.

It is already known that, in order that the HEMT-device epitaxial substrate can be structured with a high breakdown voltage, it is effective to increase the total film thickness of the channel layer and the barrier layer and to improve the electrical breakdown strength of both of the layers (for example, see Non-Patent Documents 2 to 5).

However, it is known that forming a nitride film of good quality on a silicon substrate is very difficult as compared with a case of using a sapphire substrate or a SiC substrate, for the following reasons.

Firstly, the values of the lattice constants of silicon and a nitride material are greatly different from each other. This causes a misfit dislocation at an interface between the silicon substrate and a growth film, and facilitates a three-dimensional growth mode at a timing from the nucleus formation to the growth. In other words, this is a factor that hinders the formation of a good nitride epitaxial film having a low dislocation density and a flat surface.

Additionally, the nitride material has a higher thermal expansion coefficient value than that of silicon. Therefore, in the step of lowering, the temperature to the vicinity of the room temperature after a nitride film is epitaxially grown on the silicon substrate at a high temperature, a tensile stress acts in the nitride film. As a result, it is likely that cracking occurs in a film surface and large warping occurs in the substrate.

Moreover, it is also known that trimethylgallium (TMG) that is a material gas of the nitride material for a vapor-phase growth is likely to form a liquid-phase compound with silicon, which is a factor that hinders the epitaxial growth.

In a case where the conventional techniques disclosed in the Patent Documents 1 to 3 and in the Non-Patent Document 1 are adopted, it is possible to cause an epitaxial growth of a GaN film on the silicon substrate. However, the resulting GaN film never has a better crystal quality as compared with a case of using SiC or sapphire for the base substrate. Therefore, preparing an electronic device such as a HEMT using the conventional techniques involves problems of a low electron mobility, a leakage current during the off-time, and a low breakdown voltage.

A method disclosed in the Non-Patent Document 3 exerts a certain effect in improvement in the breakdown voltage of a HEMT device, but it is known that as the film thickness increases, the distance between a substrate and a barrier-layer/channel layer interface increases and consequently the effect of a field plate of a back surface is reduced.

Using a method disclosed in the Non-Patent Document 4 may enable improvement in the breakdown voltage of a HEMT device without largely increasing the film thickness. However, since a portion where a two-dimensional electron gas travels is also formed of a mixed crystal compound, there is a problem that the electron mobility is reduced due to so-called alloy scattering and thus the on-resistance is increased.

Using a method disclosed in the Non-Patent Document 5 may enable increase in the breakdown voltage of a HEMT device while suppressing reduction of the mobility of a two-dimensional electron gas. However, there is a problem that a lamination of GaN and AlGaN causes a band discontinuity and a lattice discontinuity and therefore a concentration of the electric field partially occurs when a high electric field is applied, which results in lowering of the breakdown voltage and increase in the leakage current during the off-time.

In the first place, the disclosure of the Non-Patent Documents 3 to 5 is not for a case of forming a nitride film on a silicon substrate. In order to obtain the breakdown voltage improvement effect as described above even in a case of forming a nitride film, as a prerequisite therefor, a nitride film having a good quality has to be formed on a silicon substrate. However, a method for obtaining compatibility and consistency between ensuring of the quality of a nitride film and improvement in the breakdown voltage properties is neither disclosed nor suggested in any of the Non-Patent Documents 3 to 5.

PRIOR-ART DOCUMENTS

Patent Documents

Patent Document 1: Japanese Patent Application Laid-Open No. 10-163528 (1998)
Patent Document 2: Japanese Patent Application Laid-Open No. 2004-349387
Patent Document 3: Japanese Patent Application Laid-Open No. 2005-350321
Non-Patent Documents
Non-Patent Document 1: "Highly Reliable 250 W GaN High Electron Mobility Transistor Power Amplifier", Toshihide Kikkawa, Jpn. Appl. Phys. 44, (2005), 4896.
Non-Patent Document 2: "High power AlGaN/GaN HFET with a high breakdown voltage of over 1.8 kV on 4 inch Si substrates and the suppression of current collapse", Nariaki Ikeda, Svuusuke Kaya, Jiang Li, Yoshihiro Sato, Sadahiro Kato, Seikoh Yoshida, Proceedings of the 20th International Symposium on Power Semiconductor Devices & IC's May 18-22, 2008 Orlando, Fla.", pp. 287-290
Non-Patent Document 3: Applied Physics Express 1 (2008) 011101
Non-Patent Document 4: IEICE Technical Report, Vol. 106, No. 459 (2007), 189-192
Non-Patent Document 5: IEICE Technical Report, Vol. 108, No. 376 (2009), pp 129-133

SUMMARY OF THE INVENTION

The present invention has been made in view of the problems described above, and an object of the present invention is to provide an epitaxial substrate in which a silicon substrate is used as a base substrate, that allows a HEMT device with a high breakdown voltage to be achieved.

To solve the above-described problems, in a first aspect of the present invention, an epitaxial substrate for a semiconductor element, which a group of group-III nitride layers are formed on a base substrate made of (111)-oriented single crystal silicon such that a (0001) crystal plane of the group of group-III nitride layers is substantially in parallel with a substrate surface of the base substrate, the epitaxial substrate, includes: a first group-III nitride layer made of AlN and formed on the base substrate; a second group-III nitride layer made of $Al_pGa_{1-p}N$ ($0 \leq p < 1$) and formed on the first group-III nitride layer; a third group-III nitride layer expressed by a composition formula of $Al_qGa_{1-q}N$ ($0 \leq q \leq 1$) and epitaxially formed on the second group-III nitride layer; and at least one fourth group-III nitride layer epitaxially formed on the third group-III nitride layer. The first group-III nitride layer is a layer with many crystal defects configured of at least one kind from a columnar or granular crystal or domain. An interface between the first group-III nitride layer and the second group-III nitride layer is shaped into a three-dimensional concave-convex surface. The third group-III nitride layer is formed as a graded composition layer in which the proportion of existence of Al in a group-III element continuously decreases progressively from a first boundary portion at a boundary with the second group-III nitride layer toward a second boundary portion at a boundary with the fourth group-III nitride layer.

In a second aspect of the present invention, in the epitaxial substrate for a semiconductor element according to the first aspect, the rate of change of the proportion of existence of Al in the third group-III nitride layer is 0.13%/nm or less.

In a third aspect of the present invention, in the epitaxial substrate for a semiconductor element according to the first aspect, $t2 \leq 40e^{0.0017t1}$ is satisfied, when the thickness of the third group-III nitride layer is defined as t1 (nm), and the thickness of the fourth group-III nitride is defined as t2 (nm).

In a fourth aspect of the present invention, in the epitaxial substrate for a semiconductor element according to the first aspect, the thickness of the third group-III nitride layer is 1 μm or more and 3 μm or less.

In a fifth aspect of the present invention, in the epitaxial substrate for a semiconductor element according to the first aspect, the fourth group-III nitride layer includes a layer made of GaN, as a layer adjacent to the third group-III nitride layer; and the second boundary portion of the third group-III nitride layer is made of GaN.

In a sixth aspect of the present invention, in the epitaxial substrate for a semiconductor element according to the first aspect, when q=qa is established in the first boundary portion of the third group-III nitride layer, $0.8 \leq qa \leq 1$ is satisfied.

In a seventh aspect of the present invention, in the epitaxial substrate for a semiconductor element according to the sixth aspect, the first boundary portion of the third group-III nitride layer is made of AlN.

In an eighth aspect of the present invention, in the epitaxial substrate for a semiconductor element according to the first aspect, a plurality of the third group-III nitride layers are laminated.

In a ninth aspect of the present invention, the epitaxial substrate for a semiconductor element according to the first aspect further includes a layer made of AlN and provided between the third group-III nitride layer and the fourth group-III nitride layer.

In a tenth aspect of the present invention, the epitaxial substrate for a semiconductor element according to the first aspect further includes a superlattice structure layer provided between the second group-III nitride layer and the third group-III nitride layer, the superlattice structure layer being formed by periodically laminating two or more kinds of group-III nitride layers having different compositions.

In an eleventh aspect of the present invention, in the epitaxial substrate for a semiconductor element according to the first aspect, an acceptor element is doped in the third group-III nitride layer.

In a twelfth aspect of the present invention, in the epitaxial substrate for a semiconductor element according to the eleventh aspect, the acceptor element is Mg.

In a thirteenth aspect of the present invention, in the epitaxial substrate for a semiconductor element according to any one of the first to twelfth aspects, a donor element is doped in the second group-III nitride layer.

In a fourteenth aspect of the present invention, in the epitaxial substrate for a semiconductor element according to the thirteenth aspect, the donor element is Si.

In a fifteenth aspect of the present invention, a semiconductor element is prepared by using the epitaxial substrate according to the first aspect.

In a sixteenth aspect of the present invention, a method for manufacturing an epitaxial substrate for a semiconductor element, in which a group of group-III nitride layers are formed on a base substrate made of (111)-oriented single crystal silicon such that a (0001) crystal plane of the group of group-III nitride layers is substantially in parallel with a substrate surface of the base substrate, includes: a first formation step for forming, on the base substrate, a first group-III nitride layer made of AlN; a second formation step for forming, on the second group-III nitride layer, a second group-III nitride layer made of $Al_pGa_{1-p}N$ ($0 \leq p \leq 1$); a third formation step for epitaxially forming, on the second group-III nitride layer, a third group-III nitride layer expressed by a composition formula of $Al_qGa_{1-q}N$ ($0 \leq q \leq 1$); and a fourth formation step for epitaxially forming at least one fourth group-III nitride layer on the third group-III nitride layer. In the first formation step, the first group-III nitride layer is formed as a layer with many crystal defects configured of at least one kind from a columnar or granular crystal or domain and having a surface thereof shaped into a three-dimensional concave-convex surface. In the third form formation step, the third group-III nitride layer is formed as a graded composition layer in which the proportion of existence of Al in a group-III element continuously decreases progressively from a first boundary portion at a boundary with the second group-III nitride layer toward a second boundary portion at a boundary the fourth group-III nitride layer.

In a seventeenth aspect of the present invention, in the method for manufacturing an epitaxial substrate for a semiconductor element according to the sixteenth aspect, in the third formation step, the third group-III nitride layer is formed such that the rate of change of the proportion of existence of Al is 0.13%/nm or less.

In an eighteenth aspect of the present invention, in the method for manufacturing an epitaxial substrate for a semiconductor element according to the sixteenth aspect, the third group-III nitride layer and the fourth group-III nitride layer are formed so as to satisfy $t2 \leq 40e^{0.0017t1}$, when the thickness of the third group-III nitride layer is defined as t1 (nm), and the thickness of the fourth group-III nitride is defined as t2 (nm).

In a nineteenth aspect of the present invention, in the method for manufacturing an epitaxial substrate for a semiconductor element according to the sixteenth aspect, in the third formation step, the third group-III nitride layer is formed with a thickness of 1 µm or more and 3 µm or less.

In a twentieth aspect of the present invention, in the method for manufacturing an epitaxial substrate for a semiconductor element according to the sixteenth aspect, in the third formation step, the second boundary portion of the third group-III nitride layer is formed of GaN, and in the fourth formation step, a layer adjacent to the third group-III nitride layer is formed of GaN.

In a twenty-first aspect of the present invention, in the method for manufacturing epitaxial substrate for a semiconductor element according to the sixteenth aspect, in the third formation step, the third group-III nitride layer is formed so as to satisfy $0.8 \leq qa \leq 1$ when q=qa is established in the first boundary portion of the third group-III nitride layer.

In a twenty-second aspect of the present invention, in the method for manufacturing an epitaxial substrate for a semiconductor element according to the twenty-first aspect, in the third formation step, the first boundary portion of the third group-III nitride layer is formed of AlN.

In a twenty-third aspect of the present invention, in the method for manufacturing an epitaxial substrate for a semiconductor element according, to the sixteenth aspect, in the third formation step, a plurality of the third group-III nitride layers are laminated.

In a twenty-fourth aspect of the present invention, in the method for manufacturing an epitaxial substrate for a semiconductor element according to the sixteenth aspect, after the third formation step, a layer made of AlN is formed on the third group-III nitride layer, and in the fourth formation step, the fourth group-III nitride layer is formed on the layer made of AlN.

In a twenty-fifth aspect of the present invention, in the method for manufacturing an epitaxial substrate for a semiconductor element according to the sixteenth aspect, after the second formation step, a superlattice structure layer is formed on the second group-III nitride layer, the superlattice structure layer being formed by periodically laminating two or more kinds of group-III nitride layers having different compositions; in the third formation step, the third group-III nitride layer is formed on the superlattice structure layer.

In a twenty-sixth aspect of the present invention, in the method for manufacturing an epitaxial substrate for a semiconductor element according to the sixteenth aspect, in the third formation step, the third group-III nitride layer is formed while being doped with an acceptor element.

In a twenty-seventh aspect of the present invention, in the method for manufacturing an epitaxial substrate for a semiconductor element according to the twenty-sixth aspect, the acceptor element is Mg.

In a twenty-eighth aspect of the present invention, in the method for manufacturing an epitaxial substrate for a semiconductor element according to the sixteenth aspect, in the second formation step, the second group-III nitride layer is formed while being doped with a donor element.

In a twenty-ninth aspect of the present invention, in the method for manufacturing an epitaxial substrate for a semiconductor element according to the twenty-eighth aspect, the donor element is Si.

According to the first to twenty-ninth aspects of the present invention, since the first group-III nitride layer is provided as the layer with many crystal defects which has inferior crystal properties, a lattice misfit between the base substrate and the second group-III nitride layer is relieved. Moreover, since the interface between the first group-III nitride layer and the second group-III nitride layer is shaped into the three-dimensional concave-convex surface, dislocations occurring in the first group-III nitride layer are bent at this interface and thus coalesce and disappear in the second group-III nitride layer. Therefore, even when a single crystal silicon substrate is used as a base substrate, an epitaxial substrate including a group-III nitride function layer whose quality and characteristics are equivalent to those obtained by using a sapphire substrate or a SiC substrate as a base substrate can be achieved.

Additionally, since the third group-III nitride layer is formed as the graded composition layer in which the proportion of existence of Al in the group-III element continuously decreases progressively from the first boundary portion at the boundary with the second group-III nitride layer toward the second boundary portion at the boundary with the fourth group-III nitride layer, a crack-free epitaxial substrate in which warping is suppressed and the dislocation density is reduced can be achieved.

Using such an epitaxial substrate allows a semiconductor element such as a HEMT to be provided at a lower cost than using a sapphire substrate or a SiC substrate, and moreover can increase the breakdown voltage, or furthermore, can reduce the leakage current.

BRIEF DESCRIPTION OF THE DRAWINGS

FIG. 2 is a diagram showing a HAADF (high-angle annular dark-field) image of the epitaxial substrate 10.

FIG. 3 is a diagram schematically showing disappearance of dislocations in the epitaxial substrate 10.

FIG. 5 is a schematic cross-sectional view showing an outline configuration of an epitaxial substrate 20 according to a second embodiment of the present invention.

FIG. 6 is a schematic cross-sectional view showing an outline configuration of an epitaxial substrate 30 according to a third embodiment of the present invention.

FIG. 7 is a schematic cross-sectional view showing an outline configuration of an epitaxial substrate 40 according to a fourth embodiment of the present invention.

FIG. 9 is a diagram showing a list of evaluation results with respect to specimens of the example 1, a comparative example 1, and the comparative example 2.

FIG. 10 is a diagram showing a list of evaluation results with respect to specimens of the example 2.

DETAILED DESCRIPTION OF THE INVENTION

First Embodiment

Outline Configuration of Epitaxial Substrate

Figure 1:
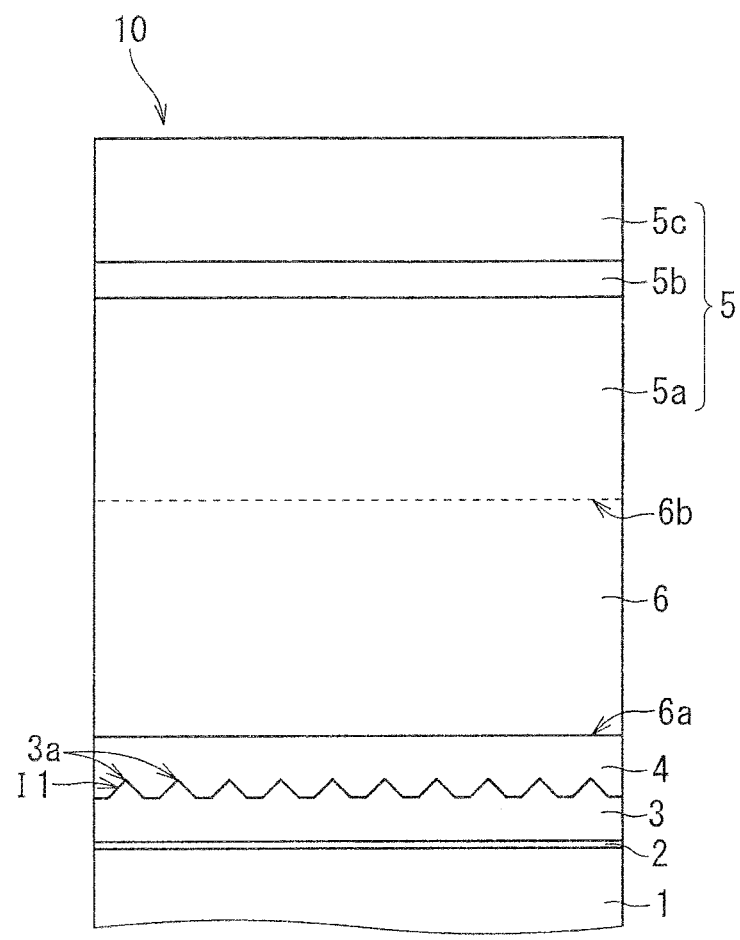
FIG. 1 is a schematic cross-sectional view showing an outline configuration of an epitaxial substrate 10 according to a first embodiment of the present invention.

FIG. 1 is a schematic cross-sectional view showing an outline configuration of an epitaxial substrate 10 according to a first embodiment of the present invention.

The epitaxial substrate 10 mainly includes a base substrate 1, an initial layer 3, a first intermediate layer 4, a function layer 5, and a graded composition layer 6. In the epitaxial substrate 10, as shown in FIG. 1, an interface layer 2 may be provided between the base substrate 1 and the initial layer 3. The interface layer 2 will be described later. In the following, the layers formed on the base substrate 1 will be sometimes collectively referred to as an epitaxial film. Here, for convenience of the description, the proportion of existence of Al in the group-III element will be sometimes referred to as AlN mole fraction.

The base substrate 1 is a wafer of (111) plane single crystal silicon. The thickness of the base substrate 1 is not particularly limited, but for convenience of handling, it is preferable to use the base substrate 1 having a thickness of several hundred μm to several mm.

Each of the initial layer 3, the first intermediate layer 4, the function layer 5, and the graded composition layer 6 is a layer formed of a wurtzite-type group-III nitride by using an epitaxial growth method such that its (0001) crystal plane can be substantially in parallel with a substrate surface of the base substrate 1. In a preferred example, these layers are formed by a metalorganic chemical vapor deposition method (MOCVD method).

The initial layer 3 is a layer (first group-III nitride layer) made of AlN. The initial layer 3 is a layer configured of a large number of small columnar crystals or the like (at least one kind from columnar crystals, granular crystals, columnar domains, and granular domains) that have been grown in a direction (film formation direction) substantially perpendicular to the substrate surface of the base substrate 1. In other words, the initial layer 3 is a layer with many defects having inferior crystal properties, in which, although uniaxial orientation is achieved along a lamination direction of the epitaxial substrate 10, many crystal grain boundaries or dislocations exist along the lamination direction. In this embodiment, for convenience of the description, the crystal grain boundary is sometimes used as the term inclusive of domain grain boundaries and dislocations, too. In the initial layer 3, the internal of the crystal grain boundaries is at most about several tens nm.

The initial layer 3 having this configuration is formed such that the half width of a (0002) X-ray rocking curve can be 0.5 degrees or more and 1.1 degrees or less and such that the half width of a (10-10) X-ray rocking curve can be 0.8 degrees or more and 1.1 degrees or less. The half width of the (0002) X-ray rocking curve serves as an index of the magnitude of mosaicity of a c-axis tilt component or the frequency of screw dislocations. The half width of the (10-10) X-ray rocking curve serves as an index of the magnitude of mosaicity of a crystal rotation component whose rotation axis is c-axis or the frequency of edge dislocations.

On the other hand, the first intermediate layer 4 is a layer (second group-III nitride layer) made of a group-III nitride having a composition of $Al_pC_{1-p}N$ ($0 \leq p \leq 1$), and formed on the initial layer 3. In the epitaxial substrate 10 according to this embodiment, the crystal quality of an epitaxial film and the state of accumulation of strain energy vary between the upper side and the lower side of the first intermediate layer 4, though details thereof will be described later.

The function layer 5 is at least one layer made of a group-III nitride and formed on the graded composition layer 6. The function layer 5 is a layer that develops a predetermined function when predetermined semiconductor layers, electrodes, and the like, are additionally provided on the epitaxial substrate 10 to thereby form a semiconductor element. Accordingly, the function layer 5 is constituted of one or more layers having a composition and a thickness appropriate for this function.

In a case illustrated in FIG. 1, assuming that the epitaxial substrate 10 is used as a substrate of a HEMT device, a channel layer 5a made of high-resistivity GaN, a first spacer layer 5b made of AlN, and a barrier layer 5c made of AlGaN, InAlN, or the like, are formed as the function layer 5. The channel layer 5a is preferably formed with a thickness of about several μm. The first spacer layer 5b is preferably formed with a thickness of about 1 nm. However, the first spacer layer 5b is not au essential component for the configuration of a HEMT device. The barrier layer 5c is preferably formed with a thickness of about several tens nm. In such a layer configuration, due to a spontaneous polarization effect or a piezo polarization effect, a two-dimensional electron gas region is caused in a portion of the channel layer 5a near a hetero-junction interface with the barrier layer 5c (or the first spacer layer 5b).

Then a gate electrode, a source electrode, and a drain electrode, though not shown, are formed on the barrier layer 5c, and thereby a HEMT device is obtained. For forming these electrodes, a known technique such as a photolithography process is applicable.

Alternatively, a concentric Schottky diode is achieved by forming one group-III nitride layer (for example, a GaN layer) as the function layer 5 and forming an anode and a cathode thereon, though not shown. For forming these electrodes, too, the known technique such as the photolithography process is applicable.

The graded composition layer 6 is a layer made of a group-III nitride and formed between the first intermediate layer 4 and the function layer 5. The graded composition layer 6 is formed such that the proportion of existence of Al in the group-III element can continuously decrease progressively from a boundary portion 6a at the boundary with the first intermediate layer 4 toward a boundary portion 6b at the boundary with the function layer 5, that is, such that a portion closer to the first intermediate layer 4 is richer in Al while a portion closer to the function layer 5 is richer in Ga.

More specifically, the graded composition layer 6 is formed so as to satisfy at least the relationship of qb<qa, when the graded composition layer 6 is expressed as a composition formula of $Al_qGa_{1-q}N$ ($0 \leq p \leq 1$) and when q=qa is provided in the boundary portion 6a at the boundary with the first intermediate layer 4 and q=qb is provided in the boundary portion 6b at the boundary with the function layer 5. The rate of change (composition change rate) of the proportion q of existence of Al in the epitaxial growth direction is not necessarily constant, but may vary depending on locations. However, it is necessary that the maximum composition change rate is equal to or less than 0.13%/nm. In this embodiment, in the case this requirement is satisfied, it is recognized that the graded composition layer 6 is formed such that the proportion of existence of Al in the group-III element "continuously" decreases.

Preferably, the graded composition layer 6 is formed with a thickness of about 100 nm to 3 µm, and more preferably, formed with a thickness of about 1 µm to 3 µm. The graded composition layer 6 has the n-type conductivity because of residual donors. Details of the graded composition layer 6 will be described later.

<Detailed Configurations of Initial Layer and Intermediate Layer and Effects Thereof>

An interface I1 (a surface of the initial layer 3) between the initial layer 3 and the first intermediate layer 4 is a three-dimensional concave-convex surface that reflects the outer shapes of the columnar crystals and the like included in the initial layer 3. The fact that the interface I1 has such a shape is clearly confirmed in a HAADF (high-angle annular dark-field) image of the epitaxial substrate 10 illustrated in FIG. 2. The HAADF image is obtained by a scanning transmission electron microscope (STEM), and is a mapping image of the integrated intensity of electron that is inelastically scattered at a high angle. In the HAADF image, the image intensity is proportional to the square of an atomic number, and a portion where an atom having a greater atomic number exists is observed more brightly (more white).

In the epitaxial substrate 10, the initial layer 3 is made of AlN, while the first intermediate layer 4 is a layer having a composition that contains at least Ga and that is different from the composition of AlN, as indicated by the composition formula mentioned above. Since the atomic number of Ga is greater than the atomic number of Al, in FIG. 2, the first intermediate layer 4 is observed relatively bright and the initial layer 3 is observed relatively dark. Thereby, from FIG. 2, the fact the interface I1 therebetween is a three-dimensional concave-convex surface is easily recognized.

In the schematic cross-section of FIG. 1, convex portions 3a of the initial layer 3 are located at substantially regular intervals. This is merely for convenience of illustration. Actually, the convex portions 3a are not necessarily located at regular intervals. Preferably, the initial layer 3 is formed such that the density of the convex portions 3a can be $5 \times 10^9/cm^2$ or more and $5 \times 10^{10}/cm^2$ or less and the average interval of the convex portions 3a can be 45 nm or more and 140 nm or less. When these ranges are satisfied, the function layer 5 having, particularly, an excellent crystal quality can be formed. In this embodiment, the convex portion 3a of the initial layer 3 always denotes a position substantially at the apex of an upward convex portion of the surface (interface I1). From the results of experiments and observations made by the inventors of the present invention, it has been confirmed that a side wall of the convex portion 3a is formed by a (10-11) plane or (10-12) plane of AlN.

In order that the convex portions 3a that satisfy the above-mentioned density and average interval can be formed on the surface of the initial layer 3, it is preferable to form the initial layer 3 with an average film thickness of 40 nm or more and 200 nm or less. In a case where the average film thickness is less than 40 nm, it is difficult to achieve a state where the substrate surface is thoroughly covered with AlN while forming the convex portions 3a as described above. On the other hand, when the average film thickness exceeds 200 nm, flattening of an AlN surface starts to progress, to make it difficult to form the convex portions 3a described above.

The formation of the initial layer 3 is performed under predetermined epitaxial growth conditions. Here, forming the initial layer 3 with AlN is preferable in terms of not containing Ga which forms a liquid-phase compound with silicon and in terms of easily configuring the interface I1 as a three-dimensional concave-convex surface because a horizontal growth is relatively unlikely to progress.

In the epitaxial substrate 10, the initial layer 3 that is a layer with many defects in which the crystal grain boundaries exist is interposed between the base substrate 1 and the first intermediate layer 4 in the above-described manner. This relieves a lattice misfit between the base substrate 1 and the first intermediate layer 4, and thus an accumulation of strain energy caused by this lattice misfit is suppressed. The above-described ranges of the half widths of the (0002) and (10-10) X-ray rocking curves with respect to the initial layer 3 are set as ranges that can suitably suppress the accumulation of strain energy by the crystal grain boundaries.

However the interposition of the initial layer 3 causes an enormous number of dislocations originating from the crystal grain boundaries such as the columnar crystals of the initial layer 3 to propagate in the first intermediate layer 4. In this embodiment, as described above, the interface I1 between the initial layer 3 and the first intermediate layer 4 is configured as a three-dimensional concave-convex surface, and thereby the dislocations are effectively reduced. FIG. 3 is a diagram schematically showing disappearance of dislocations in the epitaxial substrate 10. In FIG. 3, the interface layer 2 which will be described later is omitted.

Since the interface I1 between the initial layer 3 and the first intermediate layer 4 is configured as a three-dimensional concave-convex surface, most of the dislocations d caused in the initial layer 3 are bent at the interface I1 during the propagation (penetration) from the initial layer 3 to the first intermediate layer 4, as shown in FIG. 3. More specifically, although dislocations d (d0) which propagate in portions of the interface I1 extending substantially in parallel with the base substrate 1 can reach the upper side of the first intermediate layer 4, dislocations d (d1) which propagate in portions of the interface I1 inclined relative to the base substrate 1 coalesce and disappear within the first intermediate layer 4. As a result, only a small part of the dislocations originating from the initial layer 3 penetrates through the first intermediate layer 4.

Preferably, although the first intermediate layer 4 is formed along the shape of the surface of the initial layer 3 in an initial stage of the growth, the surface thereof is gradually flattened along with the progress of the growth, and finally obtains a surface roughness of 10 nm or less, as schematically shown in FIG. 3. In this embodiment, the surface roughness is expressed as an average roughness ra in a region of 5 µm×5 µm which has been measured by an AFM (atomic force microscope). Here, in terms of obtaining a good surface flatness of the first intermediate layer 4, it is preferable that the first intermediate layer 4 is formed of a group-III nitride having a composition that contains at least Ga, which allows a horizontal growth to relatively easily progress.

It is preferable that the first intermediate layer 4 has an average thickness of 40 nm or more. This is because, when the average thickness is less than 40 nm, such problems arise that concaves and convexes caused by the initial layer 3 cannot sufficiently be flattened, and that the disappearance of dislocations having propagated to the first intermediate layer 4 and coalesced with each other does not sufficiently occur. In a case where the average thickness is 40 nm or more, the reduction of the dislocation density and the flattening of the surface are effectively caused. Therefore, in a technical sense, no particular limitation is put on an upper limit of the thickness of the first intermediate layer 4, but from the viewpoint of the productivity, it is preferable that the thickness is about several µm or less.

The first intermediate layer 4 formed in the above-described manner has a good crystal quality and its dislocation density is suitably reduced, at least near a surface thereof (near an interface with the graded composition layer 6). As a result, a good crystal quality is obtained in the graded composition layer 6, and additionally in the function layer 5 formed thereon. Alternatively, depending on the compositions and formation conditions of the first intermediate layer 4, the graded composition layer 6, and the function layer 5, it may be possible to form the function layer 5 with fewer dislocation than that of the first intermediate layer 4. For example, the function layer 5 having an excellent crystal quality can be formed in which the dislocation density is equal to or less than $6 \times 10^9/cm^2$ (among which the density of screw dislocations is equal to or less than $2 \times 10^9/cm^2$) and the half widths of both the (0002) and (10-10) X-ray rocking curves are 1000 sec or less. That is, the function layer 5 is formed as a layer having fewer dislocation, very excellent crystal properties, and a further lower mosaicity than that of the initial layer 3.

In a case where a group of group-III nitride layers (epitaxial films) having the same total film thickness is formed on a sapphire substrate or a SiC substrate with interposition of a low-temperature GaN buffer layer or the like by using the MOCVD method, the value of the dislocation density is generally in a range of $5 \times 10^8$ to $1 \times 10^{10}/cm^2$. Thus, the aforementioned result indicates that an epitaxial substrate whose quality is equivalent to the quality of an epitaxial substrate obtained by using a sapphire substrate as the base substrate 1 can be achieved by using, as the base substrate 1, a single crystal silicon wafer which is more inexpensive than the sapphire substrate.

<Interface Layer>

As described above, in the epitaxial substrate 10, the interface layer 2 may be provided between the base substrate 1 and the initial layer 3. In one preferable example, the interface layer 2 has a thickness of several nm and is made of amorphous $SiAl_xO_yN_z$.

In a case where the interface layer 2 is provided between the base substrate 1 and the initial layer 3, a lattice misfit between the base substrate 1 and the first intermediate layer 4, and the like, is more effectively relieved, and the crystal quality of the first intermediate layer 4, the graded composition layer 6, and the function layer 5 is further improved. That is, in a case where the interface layer 2 is provided, an AlN layer that is the initial layer 3 is formed such that the AlN layer can be shaped with concaves and convexes similar to a case where the interface layer 2 is not provided and such that the amount of crystal grain boundaries existing therein can be reduced as compared with the case where the interface layer 2 is not provided. Particularly, the initial layer 3 having improvement in the half width value of the (0002) X-ray rocking curve is obtained. This is because, in a case where the initial layer 3 is formed on the interface layer 2, nucleus formation of AlN, which will make the initial layer 3, is less likely to progress than in a case where the initial layer 3 is formed directly on the base substrate 1, and consequently the growth in the horizontal direction is promoted as compared with when the interface layer 2 is not provided. The film thickness of the interface layer 2 is to an extent not exceeding 5 nm. When this interface layer 2 is provided, the initial layer 3 can be formed such that the half width of the (0002) X-ray rocking curve can be in a range of 0.5 degrees or more and 0.8 degrees or less. In this case, the function layer 5 can be formed with a more excellent crystal quality in which the half width of the (0002) X-ray rocking curve is 800 sec or less and the screw dislocation density is $1 \times 10^9/cm^2$ or less.

Furthermore, in the formation of the initial layer 3, at least one of Si atoms and O atoms may diffuse and form a solid solution in the initial layer 3, or at least one of N atoms and O atoms max diffuse and form a solid solution in the base substrate 1.

<Graded Composition Layer>

Next, the graded composition layer 6 will be described in more detail.

As described above, the graded composition layer 6 is formed such that the proportion q of existence of Al in the group-III element decreases progress from the boundary portion 6a at the boundary with the first intermediate layer 4 toward the boundary portion 6b at the boundary with the function layer 5. Therefore, in the epitaxial substrate 10, the graded composition layer 6 is formed such that a difference in the composition between the boundary portion 6a and the first intermediate layer 4 adjacent thereto and a difference in the composition between the boundary portion 6b and the function layer 5 adjacent thereto are small. In other words, in the epitaxial substrate 10, a state is achieved where the first intermediate layer 4 and the function layer 5 having different composition (that is, having naturally different lattice constants) are laminated to each other substantially without causing a hetero interface therebetween. This is achieved because, in the course of the formation of the graded composition layer 6, a crystal of the group-III nitride having a composition of $Al_qGa_{1-q}N$, which makes the graded composition layer 6, tends to grow to be aligned with a crystal lattice having a smaller lattice constant (being rich in Al) that has been formed immediately before. In this case, unlike an epitaxial substrate including a hetero interface resulting from the function layer 5 being formed directly on the first intermediate layer 4, a part extending from the first intermediate layer 4 to the function layer 5 is formed without causing release of strain energy involved in lattice-misfit dislocations.

From another point of view, the graded composition layer 6 is formed in a manner to accumulate strain energy on the first intermediate layer 4 having been formed with excellent crystal properties and with an accumulation of strain energy caused by the lattice misfit between the first intermediate layer 4 and the base substrate 1 being suppressed. From the stand point of the graded composition layer 6 and the function layer 5, this means that the first intermediate layer 4 serves as a base layer containing only a small amount of strain and having excellent crystal properties.

The growth progresses in such a manner that the proportion q of existence of Al in the group-III element decreases progressively from the boundary portion 6a at the boundary with the first intermediate layer 4 toward the boundary portion 6b at the boundary the function layer 5. Therefore, in the graded composition layer 6, a portion formed later (a portion more distant from the first intermediate layer 4), a stronger compressive stress acts in an in-surface direction. During the progress of the formation of the function layer 5 subsequently performed, this compressive stress acts. In the course of the preparation of the epitaxial substrate 10, after the function layer 5 is formed, a tensile stress caused by a difference in the thermal expansion coefficient between the base substrate 1 and the epitaxial film acts in an in-plane direction, but in this embodiment, these compressive stress and tensile stress cancel and reduce each other. As a result, residual tensile stress is successfully reduced in the epitaxial substrate 10. Thereby, in the epitaxial substrate 10, even when the epitaxial film is formed with a large film thickness of about several μm, occurrence of warping and cracking in the surface can be suitably suppressed.

Figure 4:
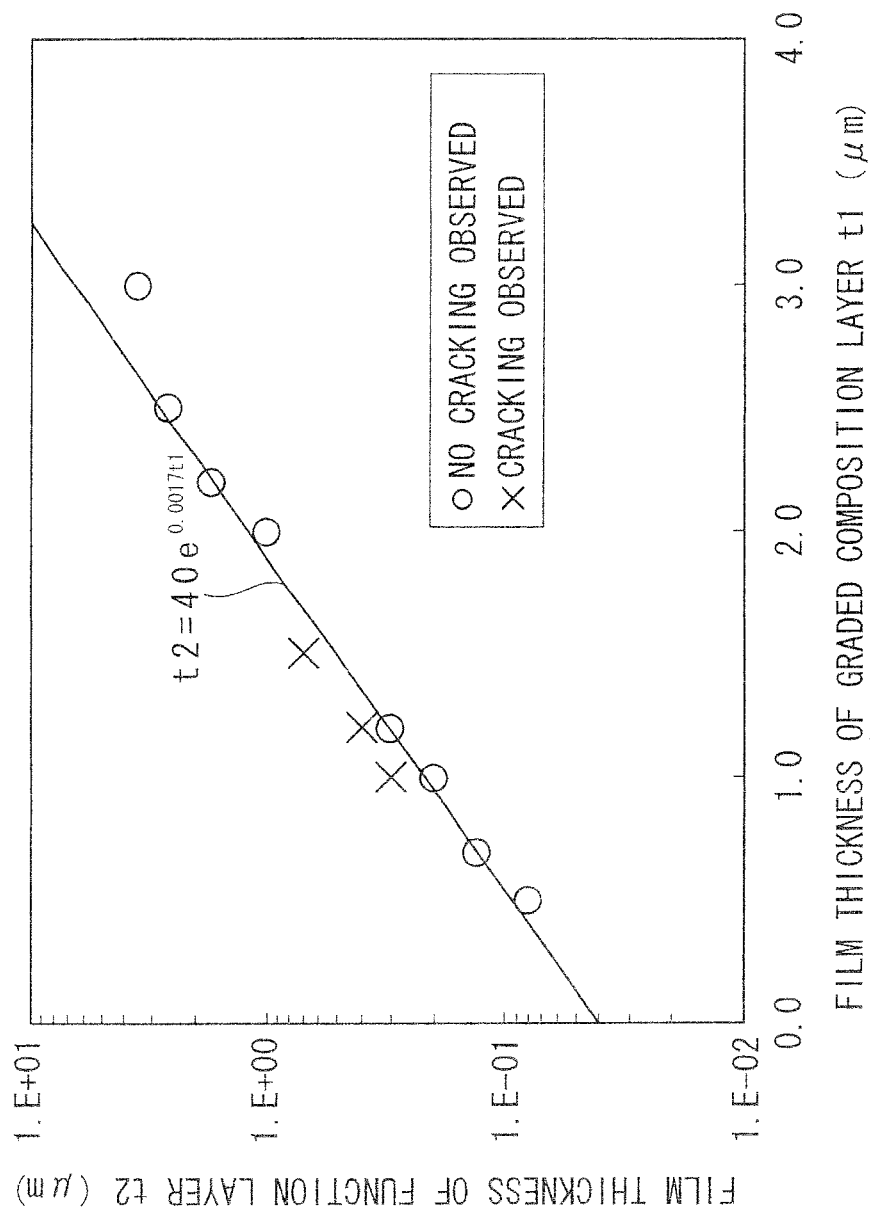
FIG. 4 is a diagram illustrating the relationship between the film thicknesses of a graded composition layer 6 and a function layer 5, and the presence or absence of cracking.

FIG. 4 is a diagram illustrating the relationship between the film thicknesses of the graded composition layer 6 and the function layer 5, and the presence or absence of cracking. More specifically, FIG. 4 shows evaluation results with respect to epitaxial substrates in which the graded composition layers 6 having various thicknesses were formed in such a manner that qa=1 and qb=0 are provided and the variation in composition (concentration gradient) linearly (like a linear function) changes between the boundary portion 6a at the boundary with the first intermediate layer 4 and the boundary portion 6b at the boundary with the function layer 5, while the function layers 5 having various thicknesses were formed of GaN. In a case where no cracking existed, the surface of any function layer 5 was a mirror surface. From the results shown in FIG. 4, it can be said that by forming the graded composition layer 6 and the function layer 5 such that a film thickness t1 (nm) turn of the graded composition layer 6 and a film thickness t2 (nm) of the function layer 5 satisfies a relationship indicated by the following expression (1), the epitaxial substrate 10 in which no cracking occurs in the function layer 5 is obtained.

$$t2 \leq 40 e^{0.0017 t1} \quad (1)$$

Moreover, in a case where the graded composition layer 6 is formed in the above-described manner, the dislocations propagating from the first intermediate layer 4 disappear within the graded composition layer 6. The formation of the graded composition layer 6 also has an effect of reducing the dislocation density in the function layer 5 formed thereon.

The effect obtained by introducing the compressive stress into the graded composition layer 6 as described above is enhanced as the difference in the composition between the boundary portion 6a at the boundary with the first intermediate layer 4 and the boundary portion 6b at the boundary with the function layer 5 in the graded composition layer 6 is larger. Accordingly, it is more preferable that the value of qa is closer to 1 and the value of qb is closer to 0.

For example, in a case where the epitaxial substrate 10 is used as a substrate of a HEMI device whose function layer 5 includes the channel layer 5a made of high resistivity GaN, the first spacer layer 5b made of AlN, and the barrier layer 5c made of AlGaN, InAlN, or the like, provided in the mentioned order, the graded composition layer 6 is preferably formed so as to satisfy $0.8 \leq qa \leq 1$ and qb=0.

For easing the lattice constant in the boundary portion 6b in order to further enhance the effect obtained by introducing the residual stress, the boundary portion 6b may be made of InN, InGaN, or the like, instead of $Al_q Ga_{1-q}N$ in which the value of q is close to 0. Here, it should be noted that the growth conditions for forming a group-III nitride containing In, such as setting of a substrate temperature and a selection of an atmosphere gas, are largely different from the growth conditions for forming $Al_q Ga_{1-q}N$.

<Relationship between Graded Composition Layer and Device Characters>

Forming the graded composition layer 6 as described above in the epitaxial substrate 10 used for preparation of an electronic device such as a HEMT device provides the following advantages.

Firstly, forming the function layer 5 made of a crystal containing only a small amount of residual stress and having a good quality on the graded composition layer 6 contributes to enhancement of the performance of the electronic device (reduction of the low on-resistance, reduction of the leakage current, and increase in the breakdown voltage).

Moreover, interposing the graded composition layer 6 between the first intermediate layer 4 and the function layer 5 to thereby increase the film thickness of the epitaxial substrate 10 in a state of crack-free and reduced warping also contributes to the increase in the breakdown voltage of the electronic device. Additionally, in this embodiment, the graded composition layer 6 is made of a group-III nitride of $Al_q Ga_{1-q}N$ having a wider band gap and a higher electrical breakdown strength than GaN that makes the channel layer 5a formed immediately thereon. That is, the graded composition layer 6 itself is a layer having a breakdown-voltage holding function. Thus, in the epitaxial substrate 10, the graded composition layer 6 can be considered as a breakdown-voltage holding layer. Therefore, in this embodiment, providing the graded composition layer 6 contributes to the increase in the breakdown voltage not only by increasing the film thickness to thereby ensure the breakdown voltage but also by exerting the breakdown-voltage holding function of the graded composition layer 6 itself. Accordingly, in the epitaxial substrate 10, the increase in the breakdown voltage can be achieved more effectively as compared with a case where the graded composition layer 6 is interposed only for the purpose of increasing the film thickness.

Furthermore, a concentration of the electric field, which tends to occur in the hetero interface, is not likely to occur in the graded composition layer 6 in which the composition continuously varies and substantially no hetero interface is formed. This contributes to the increase in the breakdown voltage and the reduction of the leakage current.

Furthermore, by forming the channel layer 5a made of GaN which is a binary mixed crystal on the graded composition layer 6, reduction of the electron mobility due to alloy scattering is suppressed, and a low on-resistance specific to a nitride HEMT is maintained.

<Method for Manufacturing Epitaxial Substrate>

Next a method for manufacturing the epitaxial substrate 10 will be generally described, for an example case of using the MOCVD method.

Firstly, a single crystal silicon wafer of a (111) plane is prepared as the base substrate 1. A natural oxide film is removed by dilute hydrofluoric acid cleaning. Then, SPM cleaning is performed to create a state where an oxide film having a thickness of several Å is formed on a wafer surface. This is set within a reactor of a MOCVD apparatus.

Then, each layer is formed under predetermined heating conditions and a predetermined as atmosphere. Firstly, for the initial layer 3 made of AlN, a substrate temperature is maintained at a predetermined initial layer formation temperature of 800° C. or higher and 1200° C. or lower, and the pressure in the reactor is set to be about 0.1 to 30 kPa. In this state, a TMA (trimethylaluminum) bubbling gas that is an aluminum raw material and a $NH_3$ gas are introduced into the reactor with an appropriate molar flow ratio. A film formation speed is set to be 20 nm/min or higher, and a target film thickness is set to be 200 nm or less. Thereby, the formation of the first base layer 2a is achieved.

In a case where, after the silicon wafer reaches the initial layer formation temperature and before the initial layer 3 is formed, only the TMA bubbling gas is introduced into the reactor to expose the wafer to a TMA bubbling gas atmosphere, the interface layer 2 made of $SiAl_xO_yN_z$ is formed.

For the formation of the first intermediate layer 4, after the formation of the initial layer 3, a substrate temperature is maintained at a predetermined intermediate layer formation temperature of 800° C. or higher and 1200° C. or lower, and the pressure in the reactor is set to be 0.1 to 100 kPa. In this state, a TMG (trimethylgallium) bubbling gas that is a gallium raw material, a TMA bubbling gas, and a $NH_3$ gas are introduced into the reactor with a predetermined flow ratio that is appropriate for a composition of the first intermediate layer 4 to be prepared. Thus, $NH_3$ is reacted with TMA and TMG. Thereby, the formation of the first intermediate layer 4 is achieved.

For the formation of the graded composition layer 6, subsequent to the formation of the first intermediate layer 4, a substrate temperature is maintained at a graded composition layer formation temperature of 800° C. or higher and 1200° C. or lower, and the pressure in the reactor is maintained at a predetermined value of 0.1 to 100 kPa. In this state, the flow ratio between a $NH_3$ gas and a group-III nitride material gas (TMA and TMG bubbling gases) that are introduced into the reactor is gradually varied in accordance with the variation in composition (concentration gradient) to be achieved in the graded composition layer 6.

For the formation of the function layer 5, after the formation of the graded composition layer 6, a substrate temperature is maintained at a predetermined function layer formation temperature of 800° C. or higher and 1200° C. or lower, and the pressure in the reactor is set to be 0.1 to 100 kPa. In this state, at least one of a TMI bubbling gas, a TMA bubbling gas, and a TMG bubbling gas, and a $NH_3$ gas are introduced into the reactor with a flow ratio that is appropriate for a composition of the function layer 5 to be prepared. Thus, $NH_3$ is reacted with at least one of TMI, TMA, and TMG. Thereby, the formation of the function layer 5 is achieved. In a case where the function layer 5 is formed of a plurality of layers having different compositions as shown in FIG. 1, preparation conditions appropriate for each layer composition are applied.

As thus far described above, in this embodiment, a crack-free epitaxial substrate having only a small amount of warping and an excellent crystal quality can be obtained in which a silicon substrate, which is easily available in a large diameter at a low cost, is adopted as a base substrate thereof. In more detail, an initial layer that is a layer with many defects having a concavo-convex structure is formed on a silicon substrate and then an intermediate layer and other layers (such as a function layer) are formed. Thereby, a lattice misfit between the silicon substrate and the intermediate layer, etc. is suppressed. Besides, reduction of the dislocations and reduction of the residual stress are achieved by interposition of a graded composition layer having an in-plane compressive stress between the intermediate layer and the function layer. Thus, an epitaxial substrate in which an epitaxial film has an increased film thickness is achieved. This increase in the film thickness improves the breakdown voltage properties of the epitaxial substrate.

Moreover, in this embodiment, in a case where an epitaxial substrate is configured as a substrate for an electronic device such as a HEMT device, the breakdown-voltage holding function can be given to the graded composition layer itself. Therefore, this breakdown-voltage holding function is superimposed on the effect of improving the breakdown voltage properties which is exerted by the increase in the film thickness described above. As a result, an electronic device having extremely more excellent breakdown voltage properties than conventional is achieved.

Second Embodiment

FIG. 5 is a schematic cross-sectional view showing an outline configuration of an epitaxial substrate 20 according to a second embodiment of the present invention.

The epitaxial substrate 20 is different from the epitaxial substrate 10 according to the first embodiment in that a plurality of graded composition layers 6 are laminated therein. Each of the graded composition layers 6 is formed in the same manner as in the first embodiment. FIG. 5 illustrates a case where a first unit graded composition layer 61 and a second unit graded composition layer 62 are laminated as the plurality of graded composition layers 6.

More specifically, the first unit graded composition layer 61 is formed on the first intermediate layer 4 in such a manner that the proportion of existence of Al in the group-III element decreases progressively from a boundary portion 61a at the boundary with the first intermediate layer 4 toward a boundary portion 61b at the boundary with the second unit graded composition layer 62. Then, on the first unit graded composition layer 61, the second unit graded composition layer 62 is formed in such a manner that the proportion of existence of Al in the group-III element decreases progressively from a boundary portion 62a at the boundary with the first unit graded composition layer 61 toward a boundary portion 62b at the boundary with the function layer 5.

In the epitaxial substrate 20 having this configuration, although there is a discontinuity in the composition at an interface between the Ga-rich boundary portion 61b and the Al-rich boundary portion 62a, the first unit graded composition layer 61 is formed so that an in-plane compressive stress is applied, and therefore a crystal growth of the second unit graded composition layer 62 occurs while maintaining alignment with the first unit graded composition layer 61.

As a result, a compressive stress acts in the function layer 5 formed on the second unit graded composition layer 62, similarly to the function layer 5 of the epitaxial substrate 10 according to the first embodiment. Accordingly, in the epitaxial substrate 20, similarly to the epitaxial substrate 10 according to the first embodiment, a residual tensile stress is reduced and warping is suppressed.

The total film thickness of the epitaxial substrate 20 is greater than that of the epitaxial substrate 10 according to the first embodiment. Therefore, in an electronic device using it, a further higher breakdown voltage is achieved while warping is suppressed as compared with a case of using the epitaxial substrate 10.

Third Embodiment

FIG. 6 is a schematic cross-sectional view showing an outline configuration of an epitaxial substrate 30 according to a third embodiment of the present invention.

The epitaxial substrate 30 is different from the epitaxial substrate 10 according to the first embodiment, in that a second intermediate layer 7 is provided between the graded composition layer 6 and the function layer 5.

The second intermediate layer 7 is preferably formed of AlN with a thickness of about one nm to several tens nm.

In the epitaxial substrate 30 having this configuration, the Al-rich second intermediate layer 7 is formed on the Ga-rich boundary portion 6b of the graded composition layer 6.

Thereby, although there is a discontinuity in the composition at an interface therebetween, the graded composition layer 6 is formed so that an in-plane compressive stress is applied, and therefore a crystal growth of the second intermediate layer 7 occurs while maintaining alignment with the graded composition layer 6.

As a result, a compressive stress acts in the function layer 5 formed on the second intermediate layer 7, similarly to the epitaxial substrate 10 according to the first embodiment. Accordingly, in the epitaxial substrate 30, a residual tensile stress is further reduced and warping is further suppressed, as compared with the epitaxial substrate 10 according to the first embodiment.

Fourth Embodiment

FIG. 7 is a schematic cross-sectional view showing an outline configuration of an epitaxial substrate 40 according to a fourth embodiment of the present invention.

The epitaxial substrate 40 is different from the epitaxial substrate 10 according to the first embodiment, in that a superlattice structure layer 8 is provided between the first intermediate layer 4 and the graded composition layer 6.

The superlattice structure layer 8 is formed by alternately and repeatedly laminating a first unit layer 8a and a second unit layer 8b that are two kinds of group-III nitride layers having different compositions. Here, a pair of one first unit layer 8a and one second unit layer 8b is also called a pair layer.

The superlattice structure layer 8 has a function for further relieving a straw in the in-plane direction of the first intermediate layer 4, which is caused by a difference in the expansion coefficient between the group-III nitride and the single crystal silicon wafer serving as the base substrate 1, to thereby further suppress propagation of a strain to the graded composition layer 6.

In the epitaxial substrate 40 including, the superlattice structure layer 8, the total film thickness of the epitaxial film is greater than that of the epitaxial substrate 10 according to the first embodiment, and therefore breakdown voltage properties thereof are further higher than those of the epitaxial substrate 10.

Even if the superlattice structure layer 8 is interposed, the crystal quality of the graded composition layer 6 and the function layer 5 can be ensured to a sufficient extent (to an extent comparable to a case where the superlattice structure layer 8 is not provided) as long as the formation conditions are set in a suitable manner.

In one preferable example, in the superlattice structure layer 8, the first unit layer 8a is formed of GaN with a thickness of about several tens nm, and the second unit layer 8b is formed of AlN with a thickness of about several nm.

In the epitaxial substrate 40, the strain existing in the first intermediate layer 4 is released more sufficiently than in the first embodiment by repeatedly forming the pair layers, and thereafter the graded composition layer 6 and the function layer 5 are formed. Thereby, occurrence of cracking and warping caused by a difference in the thermal expansion coefficient between the base substrate 1 and a group of group-III nitride layers is further suitably suppressed. In other words, the superlattice structure layer 8 has a strain relieving capability for, in the epitaxial substrate 10, relieving propagation of strain to the graded composition layer 6 and the function layer 5. Additionally, the total film thickness of the epitaxial substrate 40 is greater than that of the epitaxial substrate 10 according to the first embodiment. Therefore, in an electronic device using it, a further higher breakdown voltage is achieved while warping is suppressed as compared with a case of using the epitaxial substrate 10.

<Modification>

Although in the embodiments described above, the graded composition layer 6 exhibits the n-type conductivity due to the residual donors, compensation doping of an acceptor element may be performed at the time of the formation to thereby make the graded composition layer 6 highly resistive. For example, in one preferable example, Mg is doped in about $1 \times 10^{-8}/cm^3$ to $1 \times 10^{20}/cm^3$. In a case of forming an epitaxial substrate by the MOCVD method, the doping of Mg is made by adopting a $Cp_2Mg$ bubbling gas as a material gas.

Using an epitaxial substrate in which an acceptor element is doped in the graded composition layer 6 for the formation of a Schottky diode enables further reduction of a reverse leakage current.

It may be also acceptable to dope a donor element at the time of the formation of the first intermediate layer 4. For example, in a preferable example, Si is doped in about $1 \times 10^{16}/cm^3$ to $1 \times 10^{17}/cm^3$. In a case of forming an epitaxial substrate by the MOCVD method, the doping of Si is made by adopting a $SiH_4$ bubbling gas as a material gas.

In a case where an epitaxial substrate in which a donor element is doped in the first intermediate layer 4 is used for the formation of a Schottky diode, an end of a depletion layer that spreads from a Schottky electrode at a time of voltage application can be kept within the graded composition layer 6. That is, extension of the depletion layer into the base substrate 1 (so-called punch-through) is prevented. Thus, the breakdown voltage properties of the Schottky diode are further improved.

EXAMPLES

Example 1 Comparative Example 1, and Comparative Example 2

In an example 1, five kinds of epitaxial substrates 10 (specimens a-1 to a-5) were prepared which were different from one another in terms of conditions under which the graded composition layer 6 that is expressed by a composition formula of $Al_qGa_{1-q}N$ ($0 \leq q \leq 1$) was formed. In a comparative example 1, two kinds of epitaxial substrates specimens b-1 to b-2) were prepared in which the graded composition layer 6 was not provided. Additionally, comparative example 2, two kinds of epitaxial substrates (specimens c-1 to c-2) were prepared in the same procedure as in the example 1 except that instead of the graded composition layer 6, a layer (referred to as a discontinuous composition layer) was provided whose composition was varied stepwise though the composition was expressed by the same composition formula $Al_qGa_{1-q}N$ ($0 \leq q \leq 1$) as the composition formula for the graded composition layer 6. In any of the specimens, the formation of the interface layer 2 was omitted.

Until the formation of the first intermediate layer 4, the same procedure was performed for any of the specimens. A (111) plane single crystal silicon wafer (hereinafter, a silicon wafer) having a diameter of 4 inch and a substrate thickness of 525 μm was prepared as the base substrate 1. The prepared silicon wafer was subjected to dilute hydrofluoric acid cleaning using dilute hydrofluoric acid having a composition of hydrofluoric-acid/pure-water=1/10 (volume ratio), and to SPM cleaning using cleaning liquid having a composition of sulfuric-acid/aqueous-hydrogen-peroxide=1/1 (volume ratio). Thus, a state was created in which an oxide film having a thickness of several Å was formed on the wafer surface, which was then set in a reactor of a MOCVD apparatus. Then, a hydrogen/nitrogen mixed atmosphere was created in the reactor, and the pressure in the reactor was set to be 15 kPa. Heating was performed until the substrate temperature reached 1100° C. that is the initial layer formation temperature.

When the substrate temperature reached 1100° C., a $NH_3$ gas was introduced into the reactor, and the substrate surface was exposed to a $NH_3$ gas atmosphere for one minute.

Then, a TMA bubbling gas was introduced into the reactor with a predetermined flow ratio, to react $NH_3$ with TMA, so that the initial layer 3 whose surface was shaped with three-dimensional concaves and convexes was formed. At this time, the growing speed (film formation speed) of the initial layer 3 was set to be 20 nm/min, and the target average film thickness of the initial layer 3 was set to be 100 nm.

After the initial layer 3 was formed, then the substrate temperature was set to be 1100° C. and the pressure in the reactor was set to be 15 kPa. A TMG bubbling gas was further introduced into the reactor, to react $NH_3$ with TMA and TMG, so that an $Al_{0.3}Ga_{0.7}N$ layer serving as the first intermediate layer 4 was formed so as to have an average film thickness of about 50 nm.

The specimens obtained after the above-described steps were subjected to a structure analysis using a TEM (transmission-type electron microscope) and a HAADF (high-angle annular dark-field) image. As a result, it was confirmed that an AlN layer serving as the initial layer 3 was deposited in such a manner that a surface thereof has a three-dimensional concave-convex shape. It was also confirmed that the density of the convex portions 3a was about $1\times10^{10}/cm^2$ and the average intervals of the convex portions 3a was about 100 nm. The half width of the X-ray rocking curve was measured with respect to the AlN layer, resulting in that the half width was about 0.8 degrees (2870 sec) with respect to both of the (0002) and (10-10) planes.

The dislocation density in the $Al_{0.3}Ga_{0.7}N$ layer was evaluated. The result was that the average value with respect to the entire layer was about $1\times10^{11}/cm^2$ (for the screw dislocations, about $1\times10^{10}/cm^2$), while the average value with respect to a surface of the $Al_{0.3}Ga_{0.7}N$ layer was about $1\times10^{10}/cm^2$ (for the screw dislocations, about $2\times10^9/cm^2$). Thus, it was confirmed that many dislocations coalesced and disappeared in the course of the growth of the AlGaN film.

Figure 8:
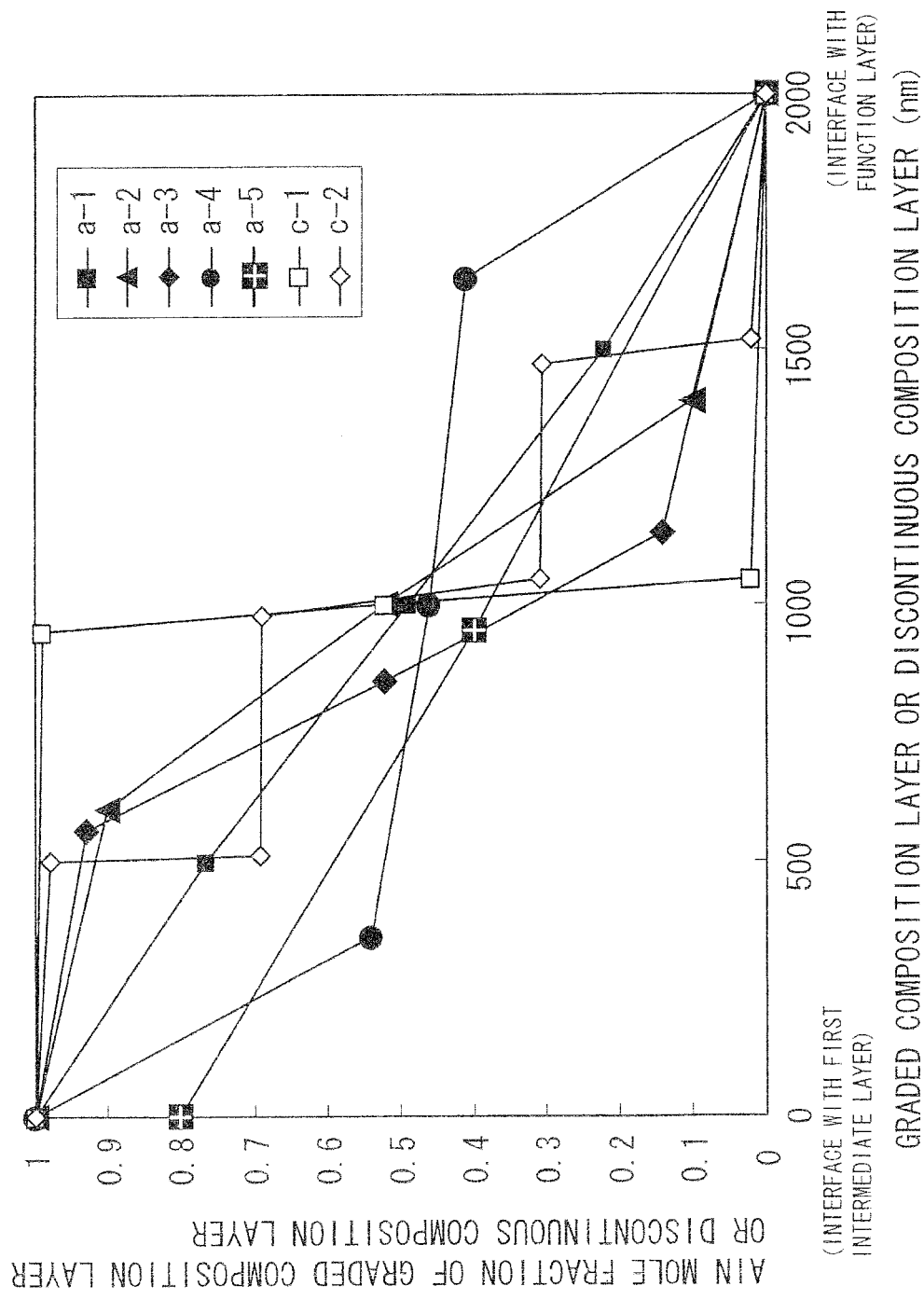
FIG. 8 is a diagram showing concentration gradients respect to specimens of an example 1 and a comparative example 2.

After the first intermediate layer 4 was formed, then, with respect to the specimens according to example 1 and comparative example 2, the substrate temperature was set to be 1100° C. and the pressure in the reactor was set to be 15 kPa. Thus, the graded composition layer 6 or the discontinuous composition layer was formed with a thickness of 2 μm. FIG. 8 shows the relationship between a position in the graded composition layer 6 with respect to a thickness direction thereof and the AlN note fraction, in other words, the concentration gradient, for each of the specimens of example 1 and comparative example 2. The AlN mole fraction for each of the specimens shown in FIG. 8 was a value obtained by performing a EDS (energy-dispersive X-ray spectroscopic analysis) spot analysis at a time when a cross-section of the specimen was observed using the TEM.

As shown in FIG. 8, the composition of a boundary portion of the graded composition layer at the boundary with the first intermediate layer 4 was AlN in the specimens other than the specimen a-5, and was $Al_{0.8}Ga_{0.2}N$ only in the specimen a-5. On the other hand, the composition of a boundary portion thereof at the boundary with the function layer 5 was GaN in any of the specimens. The maximum composition change rates in the specimens a-1 to a-5 and b-1 to b-2 were about 0.05%/nm about 0.1%/nm, about 0.13%/nm, about 0.13%/nm, about 0.04%/nm, about 0.98%/nm, and about 0.6%/nm, respectively.

In the specimens according to example 1 and comparative example 2, after the graded composition layer 6 or the discontinuous composition layer was formed, the substrate temperature was set to be 1100° C. and the pressure in the reactor was set to be 30 kPa. In the specimens according to comparative example 1, immediately after the first intermediate layer 4 was formed, the substrate temperature was set to be 1100° C. and the pressure in the reactor was set to be 30 kPa. Thus, TMG was reacted with $NH_3$. Thereby, a GaN layer serving as the function layer 5 was formed. The GaN layer was formed with a thickness of 800 nm only in the specimen b-2, and was formed with a thickness of 1 μm an the other specimens. As a result, the epitaxial substrates were obtained.

For the GaN layer of the obtained epitaxial substrate, the presence or absence of surface cracking was evaluated, and the dislocation density was measured. The amount of warping of the epitaxial substrate was also measured. The amount of warping of the epitaxial substrate was measured using a laser displacement gauge.

FIG. 9 shows a list of the total film thicknesses of the epitaxial films of the obtained epitaxial substrates and the results of evaluations mentioned above. As shown in FIG. 9, in the specimens b-1 and c-1, cracking was observed in the surface of the GaN layer (that is, in the surface of the epitaxial film), while in the specimens a-1 to a-5 including the graded composition layers 6, no cracking was observed. In the specimens a-1 to a-5 including the graded composition layers 6, the warping was smaller than in the specimens b-1, b-2, c-1, and c-2 not including the graded composition layer 6. This result indicates that providing the graded composition layer 6 is effective in suppressing the cracking and reducing the warping of the epitaxial substrate.

Referring to comparative examples 1 and 2, the warping of the specimen in which cracking occurred is smaller than the warping of the specimen in which no cracking occurred. It is considered that this is because the stress was released to some extent by the occurrence of cracking.

Referring to the dislocation density in the GaN layer, in the specimens a-1 to a-5 including the graded composition layers 6, the dislocation density was about $1\times10^9/cm^2$, which was as small as one-fourth to one-fifth of the dislocation density in the specimens b-1, b-2, c-1, and c-2 not including the graded composition layer 6. This result indicates that providing the graded composition layer 6 is effective in reducing the locations in the epitaxial film.

Next, except for the specimens b-1 and c-1 in which cracking occurred in the GaN layers, each of the epitaxial substrates was subjected to a photolithography process so that a Pt electrode as an anode electrode and a Ti/Al ohmic electrode as a cathode electrode were formed on the GaN layer. Thus, a concentric Schottky diode having electrode intervals of 10 μm was obtained. In this Schottky diode, in a state where both the silicon wafer and the cathode electrode were connected to the ground, the leakage current obtained when an applied voltage was 100V was evaluated as reverse current-voltage characteristics, and the breakdown voltage that was a voltage at which a diode device reached breakdown was evaluated. These evaluation results are also shown in FIG. 9.

As shown in FIG. 9, the leakage currents in the specimens a-1 to a-5 including the graded composition layers 6 were about 1/100 of the leakage current in the specimen c-2 according to comparative example 2. This is considered as an effect resulting from the reduction of the dislocations in the epitaxial film described above.

Referring to the breakdown voltage, in the specimens a-1 to a-5 including the graded composition layers 6, high breakdown voltages of 900V or higher were obtained, while in the specimen c-2 according to comparative example 2 having the same total film thickness but including the discontinuous composition layer instead of the graded composition layer 6, the breakdown voltage was only 620V. In the specimen b-2 according to comparative example 1 having a smaller total film thickness, the breakdown voltage had a further lower value of 180V. This result indicates that not only increasing the total film thickness simply but also increasing the film thickness by using the graded composition layer 6 having the breakdown-voltage holding function is effective in increasing the breakdown voltage.

Based on the comparison among example 1, comparative example 1, and comparative example 2 shown above, it is considered that using an epitaxial substrate including a graded composition layer is effective in improvement in the reverse characteristics, such as reduction of the leakage current and increase in the breakdown voltage, of a Schottky diode.

Example 2

Ten kinds of epitaxial substrates (specimens d-1 to d-10) were prepare in the same procedure as in example 1 except that the film thickness of the graded composition layer 6 and the film thickness of the GaN layer serving as the function layer 5 were variously changed. The composition change rate in the graded composition layer 6 was set to be about 0.05%/nm, which was the same as in the specimen a-1 of example 1. In the specimens d-1 to d-7, the film thickness of the graded composition layer 6 and the film thickness of the function layer 5 were set so as to satisfy the relationship indicated by the expression (1).

For the GaN layer of the obtained epitaxial substrate, the presence or absence of surface cracking was evaluated, and the dislocation density was measured. The amount of warping of the epitaxial substrate was also measured.

Furthermore, with respect to the specimen in which no cracking occurred in a surface thereof, a concentric-type Schottky diode was prepared in the same manner as in example 1. In this Schottky diode, similarly to example 1, the leakage current obtained when an applied voltage was 100V, and the breakdown voltage were evaluated.

FIG. 10 is a diagram showing a list of the film thickness of the graded composition layer 6, the film thickness of the function layer, the total film thickness of the epitaxial film, and the respective evaluation results described above, with respect to each of the specimens. In FIG. 10, the values with respect to the specimen a-1 are also shown.

As shown in FIG. 10, in the specimens d-1 to d-7 which satisfy the expression (1), no cracking occurred, but in the specimens d-8 to d-10 which do not satisfy the expression (1), cracking occurred.

On the other hand, the amount of warping of the epitaxial substrate is smaller than that in comparative example 1 even in the specimen d-1 having the greatest value, and generally equal to or less than that in example 1. This result also indicates that providing the graded composition layer 6 can suppress the warping of the epitaxial substrate, similarly to example 1.

The dislocation density in the GaN layer varied depending on the thickness of the graded composition layer 6. In the specimens d-1 to d-5 and d-8 to d-10 in which the thickness of the graded composition layer 6 was equal to or greater than 1 μm, the dislocation density was smaller than that in the specimens d-6 to d-7 in which the thickness thereof was less than 1 μm. This result indicates that the disappearance of dislocations having propagated to the graded composition layer 6 and further to the GaN layer is facilitated as the graded composition layer 6 is formed thicker. Accordingly, in the specimens d-1 to d-5, the value of the leakage current in the Schottky diode was smaller than that in the specimen d-6 to d-7. The above result indicates that the dislocation in the epitaxial film is reduced and the leakage current in the Schottky diode is suppressed by forming the graded composition layer 6 with a thickness of 1 μm or more so as to satisfy the expression (1).

Additionally, from FIG. 10, it can be seen that a breakdown voltage of 1300V which is higher than in example 1 can be achieved by forming the graded composition lager with a thickness of 4 μm or more so as to satisfy the expression (1).

Comparative Example 3

In a comparative example 3, an epitaxial substrate was prepared in which a SiC wafer was used as a base substrate thereof.

To be specific, firstly, a (111) plane single crystal 6H-SiC wafer having a diameter of 4 inch and having the n-type conductivity was prepared as a base substrate. The prepared SiC substrate was set in a reactor of a MOCVD apparatus. Then, a hydrogen/nitrogen mixed atmosphere was created in the reactor, and the pressure in the reactor was set to be 15 kPa. The SiC wafer was heated until the substrate temperature reached 1100° C. that is a buffer layer formation temperature.

When the substrate temperature reached 1100° C., a $NH_3$ gas and a TMA bubbling gas were introduced into the reactor. Thus, as a so-called buffer layer, an AlN layer having a thickness of about 200 nm was formed.

After the buffer layer made of AlN was formed, then the substrate temperature was set to be 1100° C., and the pressure in the reactor was set to be 30 kPa. Thus, TMG was reacted with $NH_3$, so that a GaN layer corresponding to the function layer was formed with a thickness of 3 μm. As a result, the epitaxial substrate was obtained. No cracking was observed in the epitaxial substrate. The total film thickness of the prepared epitaxial substrate was 3.2 μm.

Then, by using the obtained epitaxial substrate, a Schottky diode device was prepared in the same procedure as in example 1, and the leakage current and the breakdown voltage thereof were measured. As a result, the reverse leakage current obtained when an applied voltage was 100V was $1 \times 10^{-6}$ $A/cm^2$, and the breakdown voltage was 885V.

Comparison Between Comparative Example 3 and Example 1

Comparing the evaluation results for the epitaxial substrates according to example 1 shown in FIG. 9 and the evaluation results for the epitaxial substrate according to comparative example 3 described above, it is clearly seen that the characteristics of the epitaxial substrates according to example 1 are equal or superior to the characteristics of the epitaxial substrate according to comparative example 3. Particularly, although their total film thicknesses are almost at the same level, higher breakdown voltages are obtained in the Schottky diodes using the epitaxial substrates according to example 1. This result indicates that an epitaxial substrate having more excellent characteristics can be provided by using a Si wafer which is more inexpensive than a SiC wafer.

In example 1, the graded composition layer 6 was made of a group-III nitride of $Al_qGa_{1-q}N$ which has a wider band gap and a higher electrical breakdown strength than those of the function layer made of GaN and formed immediately above, which makes a great difference in terms of the breakdown voltage though there is almost no difference in terms of the total film thickness of the epitaxial film. This indicates that the breakdown-voltage holding function of the graded composition layer 6 itself contributes to increase in the breakdown voltage.

Example 3 and Comparative Example 4

In example 3, the same steps as for the specimen a-1 of example 1 were performed until the formation of the GaN layer. Then, the substrate temperature was set to be 1100° C., and the pressure in the reactor was set to be 10 kPa. Then, TMA, TMG, and $NH_3$ were introduced into the reactor. Thus, an $Al_{0.2}Ga_{0.8}N$ layer serving as the barrier layer was formed with a thickness of 25 nm.

In a comparative example 4, the same steps as in the comparative example 3 were performed until the formation of the GaN layer. Then, the substrate temperature was set to be 1100° C., and the pressure in the reactor was set to be 10 kPa. Then, TMA, TMG, and $NH_3$ were introduced into the reactor. Thus, an $Al_{0.2}Ga_{0.8}N$ layer serving as the barrier layer was formed with a thickness of 25 nm.

For an AlGaN/GaN laminated structure of each of the epitaxial substrates prepared in the above-described procedure, the electron mobility and the two-dimensional electron density were measured. The result thereof was that, in any AlGaN/GaN laminated structure, the electron mobility of the epitaxial substrate was about 1500 $cm^2/Vs$ and the two-dimensional electron density was about $1\times10^{13}/cm^2$. This result indicates that the characteristics of the epitaxial substrate according to example 3 in which a Si wafer was used as the base substrate were equal to the characteristics of the epitaxial substrate according to comparative example 4 in which a SiC wafer was used as the base substrate.

Example 4

In an example 4, an epitaxial substrate was prepared in the same manner as for the specimen a-1 of example 1, except that, during the formation of the graded composition layer 6, a $Cp_2Mg$ bubbling gas was introduced so as to achieve a Mg concentration of about $10^{18}/cm^3$ per unit volume. Then, similarly to example 1, a Schottky diode was prepared.

The reverse characteristics of the prepared Schottky diode device were evaluated. The breakdown voltage was 975V, which is at the same level as that of each specimen of example 1. The reverse leakage current was $2\times10^{-7}$ $A/cm^2$, which is further smaller than that of the specimen a-1. This result indicates that doping of Mg provides an effect for increasing a specific resistance of the graded composition layer that exhibits an n-type conductive layer due to residual donors.

Example 5

In an example 5, an epitaxial substrate was prepared in the same manner as for the specimen a-1 of example 1, except that a $SiH_4$ gas was introduced so as to achieve a Si concentration of about $7\times10^{16}/cm^3$ per unit volume in the $Al_{0.3}Ga_{0.7}N$ layer serving as the first intermediate layer during the formation of the $Al_{0.3}Ga_{0.7}N$ layer. Then, similarly to example 1, a Schottky diode was prepared.

The reverse characteristics of the prepared Schottky diode device were evaluated. The reverse leakage current was $1\times10^{-6}$ $A/cm^2$, which is at the same level as in example 1. The breakdown voltage was 1025V, which is higher than in example 1. This result indicates that doping of a donor element in the first intermediate layer exerts an effect for preventing a depletion layer spreading from a Schottky electrode at a time of voltage application from making punch-through into a Si base substrate and for keeping an end of the depletion layer within the graded composition layer exhibiting the n-type conductivity.

Example 6

In an example 6, an epitaxial substrate according to the second embodiment was prepared. To be specific, the formation of the graded composition layer 6 was repeated twice in the same manner as for the specimen a-1 of example 1. Then, similarly to example 1, a GaN layer serving as the function layer was formed with a thickness of 1 μm. The total film thickness of the obtained epitaxial substrate was 5.15 μm.

For the obtained epitaxial substrate, similarly to example 1, the presence or absence of surface cracking was evaluated, and the dislocation density was measured. The amount of warping of the epitaxial substrate was also measured. As a result, no cracking was observed. The amount of warping was 67 μm, which is smaller than the value in comparative example 1. The dislocation density in the GaN layer was $1\times10^9/cm^2$.

Furthermore, in the same procedure as in example 1, a Schottky diode was prepared, and the leakage current and the breakdown voltage thereof were measured. As a result, the reverse leakage current obtained when an applied voltage was 100V was $1\times10^{-6}$ $A/cm^2$, which is at the same level as in example 1, and the breakdown voltage was 1660V which is higher than the epitaxial substrates according to example 1. This result indicates that forming a lamination of a plurality of graded composition layers 6 can increase the total film thickness while suppressing warping of the wafer, thereby largely improving the breakdown voltage.

Example 7

In an example 7, three kinds of epitaxial substrates different from one another in terms of the thickness of the AlN layer serving as the second intermediate layer 7 were prepared as the epitaxial substrates according to the third embodiment. The target film thicknesses of the AlN layers were set to be 5, 10, and 20 nm, respectively. More specifically, until the formation of the graded composition layer 6, the same steps as in example 1 were performed, and then, after the AlN layer having the target film thickness was formed, a GaN layer serving as the function layer was formed with a thickness of 1 μm. The total film thickness of the prepared epitaxial substrate was approximately 3.15 μm.

For the GaN layers of the three kinds of epitaxial substrates thus obtained, similarly to example 1, the presence or absence of surface cracking was evaluated, and the dislocation density was measured. The amount of warping of the epitaxial substrate was also measured. As a result, no cracking was observed in any of the three kinds of epitaxial substrates. The amounts of warping were 42, 43, and 42 μm, respectively, which were almost at the same level irrespective of the thickness of the second intermediate layer 7, and any of which is smaller than the values of example 1. The dislocation density in any GaN layer was $1\times10^9/cm^2$, as at the same level as in example 1.

Then, by using the obtained epitaxial substrate, a Schottky diode device was prepared in the same procedure as in example 1, and the leakage current and the breakdown voltage thereof were measured.

As a result, for any of the specimens, the reverse leakage current obtained when an applied voltage was 100V was $1\times10^{-6}$ A/cm$^2$, which was at the same level as in example 1. The breakdown voltages were 980V, 975V, and 977V, respectively, which were also at the same level as in example 1 irrespective of the thickness of the second intermediate layer. This result indicates that interposing the second intermediate layer between the graded composition layer and the function layer can further suppress warping of the epitaxial substrate without varying the characteristics thereof.

Example 8

In an example 8, the epitaxial substrate according to the fourth embodiment was prepared. More specifically, until the formation of the first intermediate layer 4, the same steps as in example 1 were performed, and then a pair layer having a GaN layer as the first unit layer 8a and an AlN layer as the second unit layer 8b was formed periodically 40 times. Thereby, the superlattice structure layer 8 was formed. At this time, the target film thickness of the AlN layer was set to be 5 nm, and the target film target thickness of the GaN layer was set to be 20 nm. The thickness of the obtained superlattice structure layer was 1 µm. On this periodic structure layer, the graded composition layer 6 and a GaN layer as the function layer 5 were formed in the same manner as for the specimen a-1 of example 1. The total film thickness of the obtained epitaxial substrate was 4.15 µm.

For the GaN layer of the obtained epitaxial substrate, similarly to example 1, the presence or absence of surface cracking was evaluated, and the dislocation density was measured. The amount of warping of the epitaxial substrate was also measured. As a result, no cracking was observed. The amount of warping of the epitaxial substrate was 62 µm, which is smaller than the value in comparative example 1. The dislocation density in the GaN layer was $1\times10^9$/cm$^2$.

Then, by using the obtained epitaxial substrate, a Schottky diode device was prepared in the same procedure as in example 1, and the leakage current and the breakdown voltage thereof were measured. As a result, the reverse leakage current obtained when an applied voltage was 100V was $1\times10^{-6}$ A/cm$^2$, which is at the same level as in example 1, but the breakdown voltage was 1180V, which is higher than that of the epitaxial substrate according to example 1. This result indicates that fogging a superlattice structure layer can increase the total film thickness while suppressing, warping of the wafer, thereby largely improving the breakdown voltage.

The invention claimed is:

1. An epitaxial substrate for a semiconductor element, in which a group of group-III nitride layers are formed on a base substrate made of (111)-oriented single crystal silicon such that a (0001) crystal plane of said group of group-III nitride layers is substantially in parallel with a substrate surface of said base substrate, said epitaxial substrate comprising:
    a first group-III nitride layer made of AlN and formed on said base substrate;
    a second group-III nitride layer made of $Al_pGa_{1-p}N$ ($0\leq p<1$) and formed on said first group-III nitride layer;
    a third group-III nitride layer expressed by a composition formula of $Al_qGa_{1-q}N$ ($0\leq q\leq 1$) and epitaxially formed on said second group-III nitride layer; and
    at least one fourth group-III nitride layer epitaxially formed on said third group-III nitride layer, wherein
    said first group-III nitride layer is a layer with many crystal defects configured of at least one kind from a columnar or granular crystal or domain,
    an interface between said first group-III nitride layer and said second group-III nitride layer is shaped into a three-dimensional concave-convex surface,
    said third group-III nitride layer is formed as a graded composition layer in which the proportion of existence of Al in a group-III element continuously decreases progressively from a first boundary portion at a boundary with said second group-III nitride layer toward a second boundary portion at a boundary with said fourth group-III nitride layer.

2. The epitaxial substrate for a semiconductor element according to claim 1, wherein
    the rate of change of the proportion of existence of Al in said third nitride layer is 0.13%/nm or less.

3. The epitaxial substrate for a semiconductor element according to claim 1, wherein $t2 \leq 40e^{0.0017t1}$ is satisfied, when the thickness of said third group-III nitride layer is defined as t1 (nm), and the thickness of said fourth group-III nitride is defined as t2 (nm).

4. The epitaxial substrate for a semiconductor element according to claim 1, wherein
    the thickness of said third group-III nitride layer is 1 µm or more and 3 µm or less.

5. The epitaxial substrate for a semiconductor element according to claim 1, wherein
    said fourth group-III nitride layer includes a layer made of GaN, as a layer adjacent to said third group-III nitride layer,
    said second boundary portion of said third group-III nitride layer is made of GaN.

6. The epitaxial substrate for a semiconductor element according to claim 1, wherein
    when q=qa is established in said first boundary portion of said third group-III nitride layer, $0.8 \leq qa \leq 1$ is satisfied.

7. The epitaxial substrate for a semiconductor element according to claim 6, wherein
    said first boundary portion of said third group-III nitride layer is made of AlN.

8. The epitaxial substrate for a semiconductor element according to claim 1, wherein
    a plurality of said third group-III nitride layers are laminated.

9. The epitaxial substrate for a semiconductor element according to claim 1, further comprising
    a layer made of AlN and provided between said third group-III nitride layer and said fourth group-III nitride layer.

10. The epitaxial substrate for a semiconductor element according to claim 1, further comprising
    a superlattice structure layer provided between said second group-III nitride layer and said third group-III nitride layer, said superlattice structure layer being formed by periodically laminating two or more kinds of group-III nitride layers having different compositions.

11. The epitaxial substrate for a semiconductor element according to claim 1,
    an acceptor element is doped in said third group-III nitride layer.

12. The epitaxial substrate for a semiconductor element according to claim 11, wherein
    said acceptor element is Mg.

13. The epitaxial substrate for a semiconductor element according to claim 1, wherein
a donor element is doped in said second group-III nitride layer.

14. The epitaxial substrate for a semiconductor element according to claim 13, wherein
said donor element is Si.

15. A semiconductor element prepared by using the epitaxial substrate according to claim 1.

16. A method for manufacturing an epitaxial substrate for a semiconductor element in which a group of group-III nitride layers are formed on a base substrate made of (111)-oriented single crystal silicon such that a (0001) crystal plane of said group of group-III nitride layers is substantially in parallel with a substrate surface of said base substrate, said method comprising:
a first formation step for forming, on said base substrate, a first group-III nitride layer made of AlN;
a second formation step for forming, on said second group-III nitride layer, a second group-III nitride layer made of $Al_pGa_{1-p}N$ (0≦p<1);
a third formation step for epitaxially forming, on said second group-III nitride layer, a third group-III nitride layer expressed by a composition formula of $Al_qGa_{1-p}N$ (0≦q≦1); and
a fourth formation step for epitaxially forming at least one fourth group-III nitride layer on said third group-III nitride layer,
wherein
in said first formation step, said first group-III nitride layer is formed as a layer with many crystal defects configured of at least one kind from a columnar or granular crystal or domain and having a surface thereof shaped into a three-dimensional concave-convex surface,
in said third formation step, said third group-III nitride layer is formed as a graded composition layer in which the proportion of existence of Al in a group-III element continuously decreases progressively from a first boundary portion at a boundary with said second group-III nitride layer toward a second boundary portion at a boundary with said fourth group-III nitride layer.

17. The method for manufacturing an epitaxial substrate for a semiconductor element according to claim 16, wherein
in said third formation step, said third group-III nitride layer is formed such that the rate of change of the proportion of existence of Al is 0.13%/nm or less.

18. The method for manufacturing an epitaxial substrate for a semiconductor element according to claim 16, wherein
said third group-III nitride layer and said fourth group-III nitride Layer are formed so as to satisfy $t2 \leq 40e^{0.0017t1}$ when the thickness of said third group-III nitride layer is defined as t1 (nm), and the thickness of said fourth group-III nitride is defined as t2 (nm).

19. The method for manufacturing an epitaxial substrate for a semiconductor element according to claim 16, wherein in said third formation step, said third group-III nitride layer is formed with a thickness of 1 μm or more and 3 μm or less.

20. The method for manufacturing an epitaxial substrate for a semiconductor element according to claim 16, herein
in said third formation step, said second boundary portion of said third group-III nitride layer is formed of GaN,
in said fourth formation step, a layer adjacent to said third group-III nitride layer is formed of GaN.

21. The method for manufacturing an epitaxial substrate for a semiconductor element according to claim 16, wherein
in said third formation step, said third group-III nitride layer is formed so as to satisfy 0.8≦qa≦1, when q=qa is established in said first boundary portion of said third group-III nitride layer.

22. The method for manufacturing an epitaxial substrate for a semiconductor element according to claim 21, wherein
in said third formation step, said first boundary portion of said third group-III nitride layer is formed of AlN.

23. The method for manufacturing an epitaxial substrate for a semiconductor element according to claim 16, wherein
in said third formation step, a plurality of said third group-III nitride layers are laminated.

24. The method for manufacturing an epitaxial substrate for a semiconductor element according to claim 16, wherein
after said third formation step, a layer made of AlN is formed on said third group-III nitride layer, and in said fourth formation step, said fourth group-III nitride layer is formed on said layer made of AlN.

25. The method for manufacturing an epitaxial substrate for a semiconductor element according to claim 16, wherein
after said second formation step, a superlattice structure layer is formed on said second group-III nitride layer, said superlattice structure layer being formed by periodically laminating two or more kinds of group-III nitride layers having different compositions,
in said third formation step, said third group-III nitride layer is formed on said superlattice structure layer.

26. The method for manufacturing an epitaxial substrate for a semiconductor element according to claim 16, wherein
in said third formation step, said third group-III nitride layer is formed while being doped with an acceptor element.

27. The method for manufacturing an epitaxial substrate for a semiconductor element according to claim 26, wherein
said acceptor element is Mg.

28. The method for manufacturing an epitaxial substrate for a semiconductor element according to claim 16, wherein
in said second formation step, said second group-III nitride layer is formed while being doped with a donor element.

29. The method for manufacturing an epitaxial substrate for a semiconductor element according to claim 28, wherein
said donor element is Si.

* * * * *

UNITED STATES PATENT AND TRADEMARK OFFICE
CERTIFICATE OF CORRECTION

PATENT NO. : 8,415,690 B2
APPLICATION NO. : 13/457931
DATED : April 9, 2013
INVENTOR(S) : Makoto Miyoshi et al.

It is certified that error appears in the above-identified patent and that said Letters Patent is hereby corrected as shown below:

In the Claims:

Column 27, line 24

(claim 16, line 15): change "$Al_qGa_{1-p}N$" to -- $Al_qGa_{1-q}N$ --

Column 28, line 5

(claim 20, line 2): change "herein" to -- wherein --

Signed and Sealed this
Eleventh Day of June, 2013

Teresa Stanek Rea
*Acting Director of the United States Patent and Trademark Office*